US008847159B2

(12) United States Patent
Chen et al.

(10) Patent No.: US 8,847,159 B2
(45) Date of Patent: Sep. 30, 2014

(54) ION ENERGY ANALYZER

(75) Inventors: Lee Chen, Cedar Creek, TX (US); Barton Lane, Austin, TX (US); Merritt Funk, Austin, TX (US); Jianping Zhao, Austin, TX (US); Radha Sundararajan, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 131 days.

(21) Appl. No.: 13/433,071

(22) Filed: Mar. 28, 2012

(65) Prior Publication Data
US 2012/0248310 A1  Oct. 4, 2012

Related U.S. Application Data

(60) Provisional application No. 61/468,187, filed on Mar. 28, 2011.

(51) Int. Cl.
| | |
|---|---|
| *G01T 1/185* | (2006.01) |
| *H01J 49/48* | (2006.01) |
| *H01J 37/32* | (2006.01) |
| *H05H 1/00* | (2006.01) |

(52) U.S. Cl.
CPC ......... *H01J 37/32935* (2013.01); *H01J 49/488* (2013.01); *H05H 1/0081* (2013.01)
USPC .................................................... 250/336.1

(58) Field of Classification Search
CPC ..... G01T 1/185; H01J 37/32935; H01J 37/05
USPC .................................................... 250/336.1
See application file for complete search history.

(56) References Cited

U.S. PATENT DOCUMENTS

| | | | |
|---|---|---|---|
| 4,578,589 | A | 3/1986 | Aitken |
| 4,622,094 | A | 11/1986 | Otsubo |
| 5,160,840 | A | 11/1992 | Vestal |
| 5,223,711 | A | 6/1993 | Sanderson et al. |
| 5,451,784 | A | 9/1995 | Loewenhardt et al. |

(Continued)

FOREIGN PATENT DOCUMENTS

| | | |
|---|---|---|
| JP | 08-111297 A | 4/1996 |
| JP | 2000-208295 A | 7/2000 |
| JP | 2004-235090 A | 8/2004 |

OTHER PUBLICATIONS

International Searching Authority, International Search Report and Written Opinion issued in corresponding Application No. PCT/US2012/030960 dated Sep. 24, 2012, 19 pp.

(Continued)

*Primary Examiner* — Marcus Taningco
(74) *Attorney, Agent, or Firm* — Wood, Herron & Evans, LLP

(57) ABSTRACT

An ion energy analyzer for determining an ion energy distribution of a plasma and comprising an entrance grid, a selection grid, and an ion collector. The entrance grid includes a first plurality of openings dimensioned to be less than a Debye length for the plasma. The ion collector is coupled to the entrance grid via a first voltage source. The selection grid is positioned between the entrance grid and the ion collector and is coupled to the entrance grid via a second voltage source. An ion current meter is coupled to the ion collector to measure an ion flux onto the ion collector and transmit a signal related thereto.

25 Claims, 29 Drawing Sheets

(56) References Cited

U.S. PATENT DOCUMENTS

| | | | |
|---|---|---|---|
| 5,565,681 | A | 10/1996 | Loewenhardt et al. |
| 5,650,618 | A * | 7/1997 | Tuszewski ................ 250/296 |
| 5,989,349 | A | 11/1999 | Ke et al. |
| 6,326,794 | B1 | 12/2001 | Lundquist et al. |
| 6,653,852 | B1 | 11/2003 | Benjamin |
| 6,781,393 | B2 | 8/2004 | Benjamin |
| 6,972,579 | B2 | 12/2005 | Benjamin |
| 7,045,466 | B2 | 5/2006 | Subramanian et al. |
| 7,317,192 | B2 * | 1/2008 | Ma ................... 250/396 ML |
| 7,777,179 | B2 | 8/2010 | Chen et al. |
| 7,867,409 | B2 | 1/2011 | Brcka |
| 7,875,859 | B2 | 1/2011 | Chen et al. |
| 2004/0007326 | A1 | 1/2004 | Roche et al. |
| 2005/0011611 | A1 | 1/2005 | Mahoney et al. |
| 2005/0034812 | A1 | 2/2005 | Roche et al. |
| 2005/0039852 | A1 | 2/2005 | Roche et al. |
| 2005/0115673 | A1 | 6/2005 | Samukawa et al. |
| 2005/0151544 | A1 * | 7/2005 | Mahoney et al. ............ 324/655 |
| 2006/0037701 | A1 | 2/2006 | Koshiishi et al. |
| 2006/0043063 | A1 | 3/2006 | Mahoney et al. |
| 2006/0214593 | A1 | 9/2006 | Denpoh |
| 2007/0029473 | A1 | 2/2007 | Verentchikov |
| 2007/0194245 | A1 | 8/2007 | Yevtukhov et al. |
| 2008/0017792 | A1 | 1/2008 | Enke et al. |
| 2008/0032427 | A1 | 2/2008 | Lee et al. |
| 2008/0179284 | A1 | 7/2008 | Hayes et al. |
| 2008/0179546 | A1 | 7/2008 | Lee et al. |
| 2008/0235936 | A1 | 10/2008 | Chang et al. |
| 2008/0251206 | A1 | 10/2008 | Nishio |
| 2009/0242790 | A1 | 10/2009 | Chen et al. |
| 2009/0242791 | A1 | 10/2009 | Chen et al. |
| 2009/0283315 | A1 | 11/2009 | Lee et al. |
| 2010/0243431 | A1 * | 9/2010 | Kuboi et al. ............ 204/192.33 |
| 2011/0079355 | A1 | 4/2011 | Brcka |

OTHER PUBLICATIONS

Japanese Patent Office, Machine Translation of Japanese Patent No. 08-111297, 14 pp.

Japanese Patent Office, Machine Translation of Japanese Application Publication No. 2000-208295, 10 pp.

Japanese Patent Office, Machine Translation of Japanese Application Publication No. 2004-235090, 12 pp.

Gahan et al., "Retarding field analyzer for ion energy distribution measurements at a radio-frequency biased electrode," R. Sci. Inst, vol. 79 (2008) pp. 1-9.

Gielis, J.J.H. et al., "Spectroscopic second harmonic generation during Ar + -ion bombardment of Si(100)," Phys Rev B, vol. 74, No. 6 (2006) 165311 (12pg).

Nakamura, K. et al., "Highly sensitive plasma absorption probe for measuring low-density high pressure plasmas," J. Vac. Sci. Technol., vol. 21, No. 1 (2003) 325-331.

Poate, J.M. et al., "Laser-induced reactions of platinum and other metal films," Appl. Phys. Lett., vol. 33, No. 11 (1978) pp. 918-920.

Slocum, A.H. et al., "Precision Passive Mechanical Alignment of Wafers," J. MEMS, vol. 12, No. 6 (2003) pp. 826-834.

Slocum, A.H. et al. "Precision Passive Mechanical Alignment of Wafers," Proc. IEEE 2001, 2 pages.

Tarr, M. "Thick film technology," available at http://www.ami.ac.uk/courses/topics/0255_tft/index.html, accessed Jun. 14, 2012, 20 pages.

International Searching Authority, International Preliminary Report on Patentability issued in corresponding Application No. PCT/US2012/030960 mailed Oct. 10, 2013, 15 pp.

\* cited by examiner

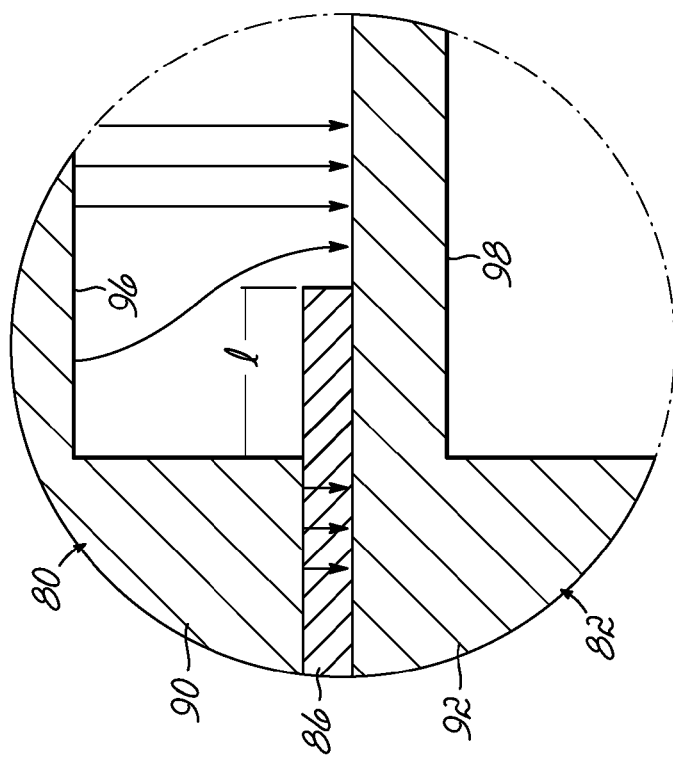
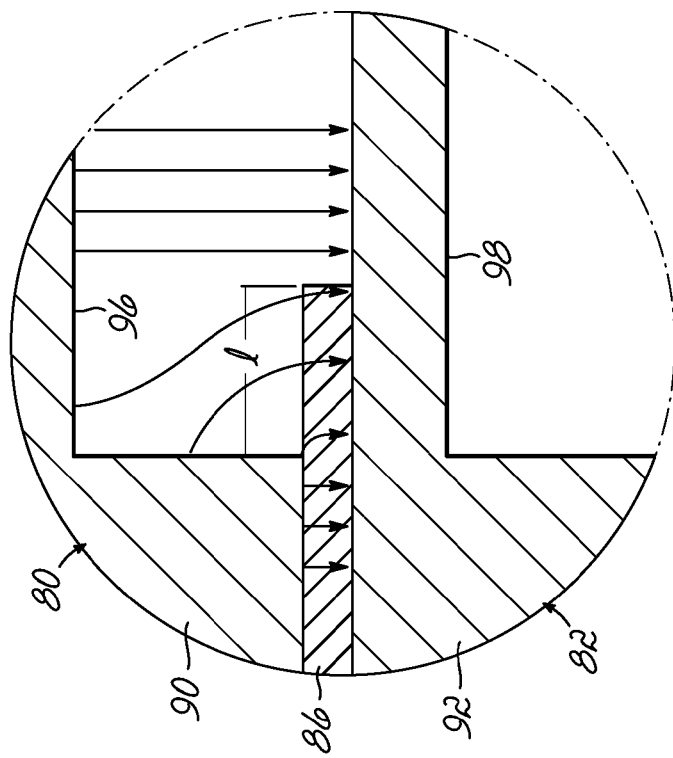

ION ENERGY ANALYZER

The present application claims the filing benefit of U.S. Provisional Patent Application No. 61/468,187, filed on Mar. 28, 2011, the disclosure of which is hereby incorporated by reference herein in its entirety. The present application is related to co-pending International Application Serial No. PCT/US2012/030960, entitled ION ENERGY ANALYZER, METHODS OF ELECTRICAL SIGNALING THEREIN, AND METHODS OF MANUFACTURING AND OPERATING THE SAME; U.S. application Ser. No. 13/433,078, entitled METHODS OF ELECTRICAL SIGNALING IN AN ION ENERGY ANALYZER; and U.S. application Ser. No. 13/433,088, entitled ION ENERGY ANALYZER AND METHODS OF MANUFACTURING THE SAME. These related, co-pending applications were filed on even date herewith and the disclosure of each is incorporated herein by reference, in its entirety. The present application is also related to commonly assigned U.S. Pat. No. 7,777,179, issued on Aug. 17, 2010, and U.S. Pat. No. 7,875,859, issued on Jan. 25, 2011, the disclosures of which are also hereby incorporated by reference herein in their entireties.

FIELD OF THE INVENTION

The present invention relates generally to ion energy analysis and, more particularly, to ion energy analyzers for measuring ion energy distributions within a plasma process system, including methods of making and using the same.

BACKGROUND OF THE INVENTION

Plasma, or more generally, an electrical discharge, has found extensive use in a variety of industrial applications, including material processing. For example, during semiconductor processing, plasma is often utilized to assist etch processes to facilitate anisotropic removal of material along fine lines or within vias (or contacts) patterned on a semiconductor substrate. Examples of such plasma-assisted etching include reactive ion etching ("RIE"), which is in essence an ion activated chemical etching process.

During plasma processing, ion energy, and more specifically, the ion energy distribution ("IED"), is a process parameter that strongly influences the outcome of the reactive process at the substrate. For example, when performing an etching process on a semiconductor device, ion energy affects etch selectivity, etch rate uniformity, sidewall profile, residue control, etc. Due to the significance of this process parameter, the measurement of ion energy and its distribution at a specific location within a plasma processing system is important for characterizing the effectiveness of the plasma.

Generally, the IED is measured by immersing a grid and an ion collector within a beam of ions. The electric potential of the grid is varied such that only the ions in the beam having sufficient energy to overcome the potential barrier imposed by the biased grid will pass through the grid and strike the ion collector. By collecting and measuring the ion current as a function of the potential on the grid, an integrated form of the IED may be acquired. Differentiation of this integral leads to the IED.

While IED has been measured extensively in plasma processes for decades using a variety of ion energy analyzers ("IEA"), there remains needed improvement. For example, most known conventional analyzers perturb the processing plasma to an extent that the measurement is no longer characteristic of the conditions prevailing when processing a substrate, fail to operate at large electric potentials, and/or exhibit substantive noise arising from secondary electron emission within the analyzer.

While many attempts have been made to cure these shortcomings, there still remains the need for improved, novel, and practical solutions to these and other problems.

SUMMARY OF THE INVENTION

The present invention overcomes the foregoing problems and other shortcomings and drawbacks of ion energy analyzers of the prior art. While the present invention will be described in connection with certain embodiments, it will be understood that the present invention is not limited to these embodiments. To the contrary, this invention includes all alternatives, modifications, and equivalents as may be included within the scope of the present invention.

According to one embodiment of the present invention, an ion energy analyzer for use in determining an ion energy distribution of a plasma includes an entrance grid, a selection grid, and an ion collector. The entrance grid forms a first surface of the ion energy analyzer and is positioned to be exposed to the plasma. The entrance grid includes a first plurality of openings, which are dimensioned to be less than a Debye length for the plasma. The ion collector forms a second surface of the ion energy analyzer and is operably coupled to the entrance grid via a first voltage source. The selection grid is positioned between the entrance grid and the ion collector and is operably coupled to the entrance grid via a second voltage source. An ion current meter is operably coupled to the ion collector and is configured to measure an ion flux onto the ion collector and to transmit a signal that represents the measured ion flux.

According to another embodiment of the present invention, a diagnostic wafer includes a substrate having a plasma exposed surface. A recess extends into the plasma exposed surface and is configured to receive the ion energy analyzer such that the entrance grid is co-extensive with the plasma exposed surface of the substrate.

Still another embodiment of the present invention is directed to a diagnostic wafer comprising a substrate and the ion energy analyzer. The substrate includes a plasma exposed surface that includes the entrance grid of the ion energy analyzer.

Another embodiment of the present invention is directed to an ion energy analyzer. The ion energy analyzer is used in determining an ion energy distribution of a plasma includes an entrance grid, a selection grid, and an ion collector. The entrance grid forms a first surface of the ion energy analyzer and is positioned to be exposed to the plasma. The entrance grid includes a first plurality of openings, which are dimensioned to be less than a Debye length for the plasma. The ion collector forms a second surface of the ion energy analyzer. A voltage source is operably coupled to the ion collector and configured to selectively and variably bias the ion collector relative to the entrance grid. An ion current meter is operably coupled to the ion collector and is configured to measure an ion flux onto the ion collector and to transmit a signal that represents the measured ion flux.

According to another embodiment of the present invention, a diagnostic wafer includes a substrate having a plasma exposed surface. A recess extends into the plasma exposed surface and is configured to receive the ion energy analyzer such that the entrance grid is co-extensive with the plasma exposed surface of the substrate.

Still another embodiment of the present invention is directed to a diagnostic wafer comprising a substrate and the ion energy analyzer. The substrate includes a plasma exposed surface that includes the entrance grid of the ion energy analyzer.

Yet another embodiment of the present invention includes an ion energy analyzer for determining an ion energy distribution of a plasma. The ion energy analyzer includes an entrance grid, a selection grid, and an ion collector. The entrance grid forms a first surface of the ion energy analyzer and is positioned to be exposed to the plasma. The entrance grid includes a first plurality of openings, which are dimensioned to be less than a Debye length for the plasma. The ion collector forms a second surface of the ion energy analyzer, and the selection grid is positioned between the entrance grid and the ion collector. A first insulator is configured to electrically isolate the entrance grid and the selection grid, and a second insulator is configured to electrically isolate the selection grid and the ion collector. An ion current meter is operably coupled to the ion collector and is configured to measure an ion flux onto the ion collector and to transmit a signal that represents the measured ion flux.

According to another embodiment of the present invention, a diagnostic wafer includes a substrate having a plasma exposed surface. A recess extends into the plasma exposed surface and is configured to receive the ion energy analyzer such that the entrance grid is co-extensive with the plasma exposed surface of the substrate.

Still another embodiment of the present invention is directed to a diagnostic wafer comprising a substrate and the ion energy analyzer. The substrate includes a plasma exposed surface that includes the entrance grid of the ion energy analyzer.

One embodiment of the present invention includes a method of generating a signal with the ion energy analyzer having a voltage source operably coupled to the selection grid. The method includes selectively and variably biasing the selection grid relative to the entrance grid.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 5A a diagram representing the encircled 5A of the IEA of FIG. 4 before charge up.

FIG. 5B is a diagram similar to FIG. 5A representing the IEA after charge up.

DETAILED DESCRIPTION

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
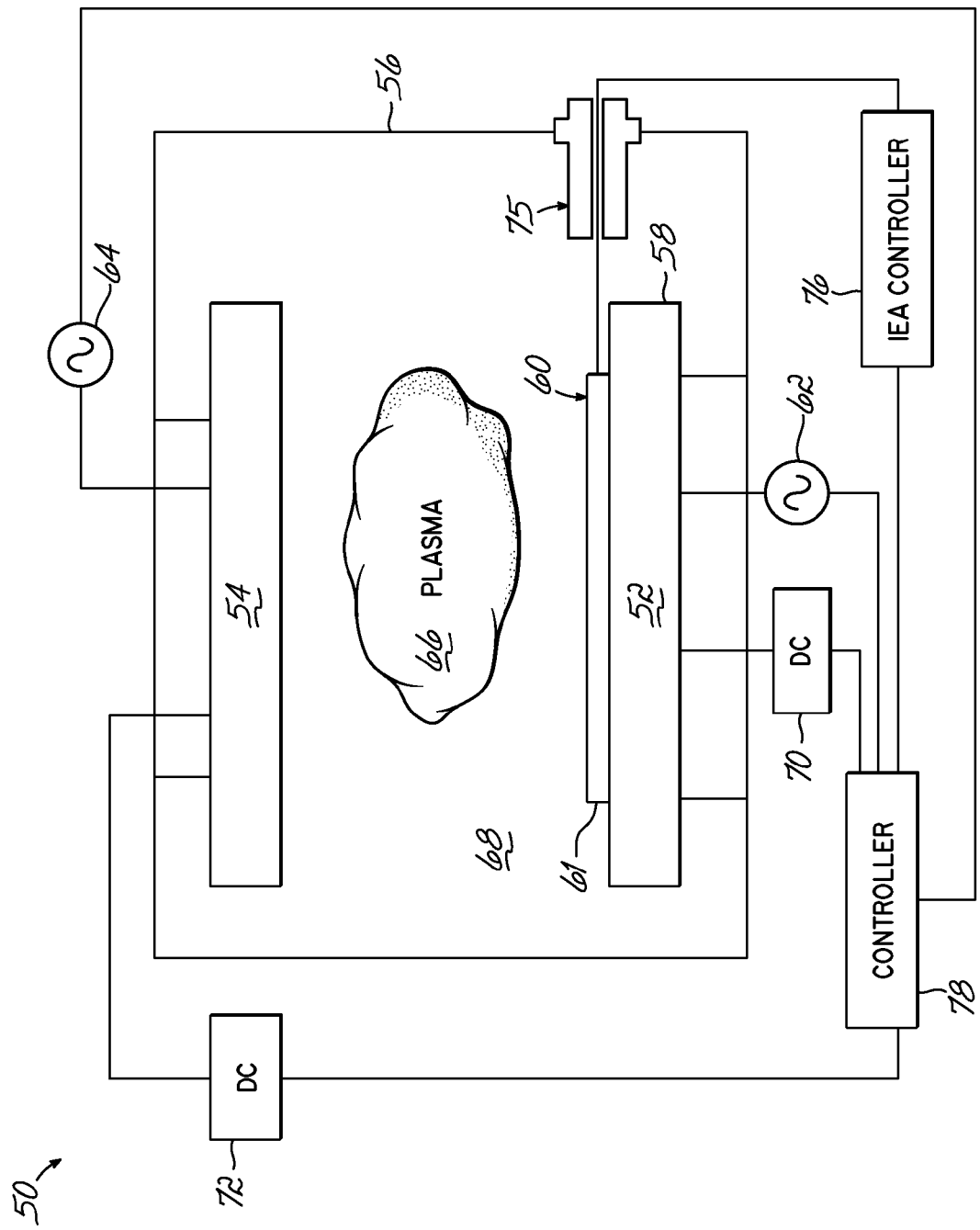
FIG. 1 is a schematic cross-sectional representation of a plasma processing system according to one embodiment of the present invention.

Referring now to the figures, and in particular to FIG. 1, a simplified schematic of a plasma processing system 50 according to one embodiment of the present invention is shown. The plasma processing system 50 comprises a first electrode 52 and a second electrode 54 disposed on generally opposing sides of a processing chamber 56, wherein the first electrode 52 is configured within a substrate holder 58 to support a diagnostic wafer 60 or a processing wafer (not shown).

The first electrode 52 may be operably coupled to a first radio frequency ("RF") power system 62 configured to provide RF power at a first RF frequency and a first RF voltage, while the second electrode 54 may be operably coupled to a second RF power system 64 configured to provide RF power at a second RF frequency and a second RF voltage. For example, the second RF frequency may be at a relatively higher RF frequency than the first RF frequency. The RF power provided to the first and second electrodes 52, 54 is operable to form a plasma 66 within a processing space 68 located between the two electrodes 52, 54.

Although both the first and second electrodes 52, 54 are shown to be coupled to RF power systems 62, 64, at least one of the electrodes may be coupled to another power system. For example, the second electrode 54 may be operably coupled to direct current ("DC") ground or a DC voltage source 70. Alternatively, the first electrode 52 may be coupled to DC ground or a DC power system 72 while the second electrode 54 is coupled to the second RF power system 64. Alternatively yet, the first electrode 52 may be coupled to the first RF power system 62 that is operable to provide multiple RF frequencies (e.g., the first RF frequency and the second RF frequency) while the second electrode 54 may be coupled to DC ground or a DC power system 72. Alternatively, the second electrode 54 may be coupled to a DC power system 70, which is pulsed or modulated with a low frequency waveform.

Additionally, the plasma processing system 50 may optionally comprise a DC power system 72 configured to provide a DC voltage to the second electrode 54. The DC power system 72 may include a variable DC power supply. Additionally, the DC power system 72 may include a bipolar DC power supply. Furthermore, the DC power system 72 may be configured to perform at least one of monitoring, adjusting, or controlling the polarity, current, voltage, or on/off state of the DC power. Once the plasma 66 is formed, the DC power system 72 may be used to facilitate high energy electron beam formation.

If so desired, an electrical filter (not shown) may be utilized to de-couple the RF power systems 62, 64 from the DC power system 72. For example, the DC voltage applied to the second electrode 54 by DC power system 72 may range from approximately −2000 volts ("V") to approximately 1000 V. Desirably, the absolute value of the DC voltage has a value that is equal to or greater than approximately 100 V, and more desirably, the absolute value of the DC voltage has a value that is equal to or greater than approximately 500 V. Additionally, it is desirable that the DC voltage has a negative polarity. Furthermore, it is desirable that the DC voltage is a negative voltage having an absolute value that is greater than the self-bias voltage generated on a surface of the second electrode 54. The surface of the second electrode 54 facing the first electrode 52 may include a silicon-containing material.

Coupling of a DC voltage, such as a negative DC voltage, to the second electrode 54 may facilitate ballistic electron beam formation, as described above. Power of the electron beam is derived from the superposition of the negative DC voltage onto the second electrode 54. As is described in U.S. Pat. No. 7,740,737, the application of a negative DC power to the plasma processing system 50 affects ballistic (or collision-less) electron beam formation that strikes a surface of the diagnostic wafer 60.

Figure 2:
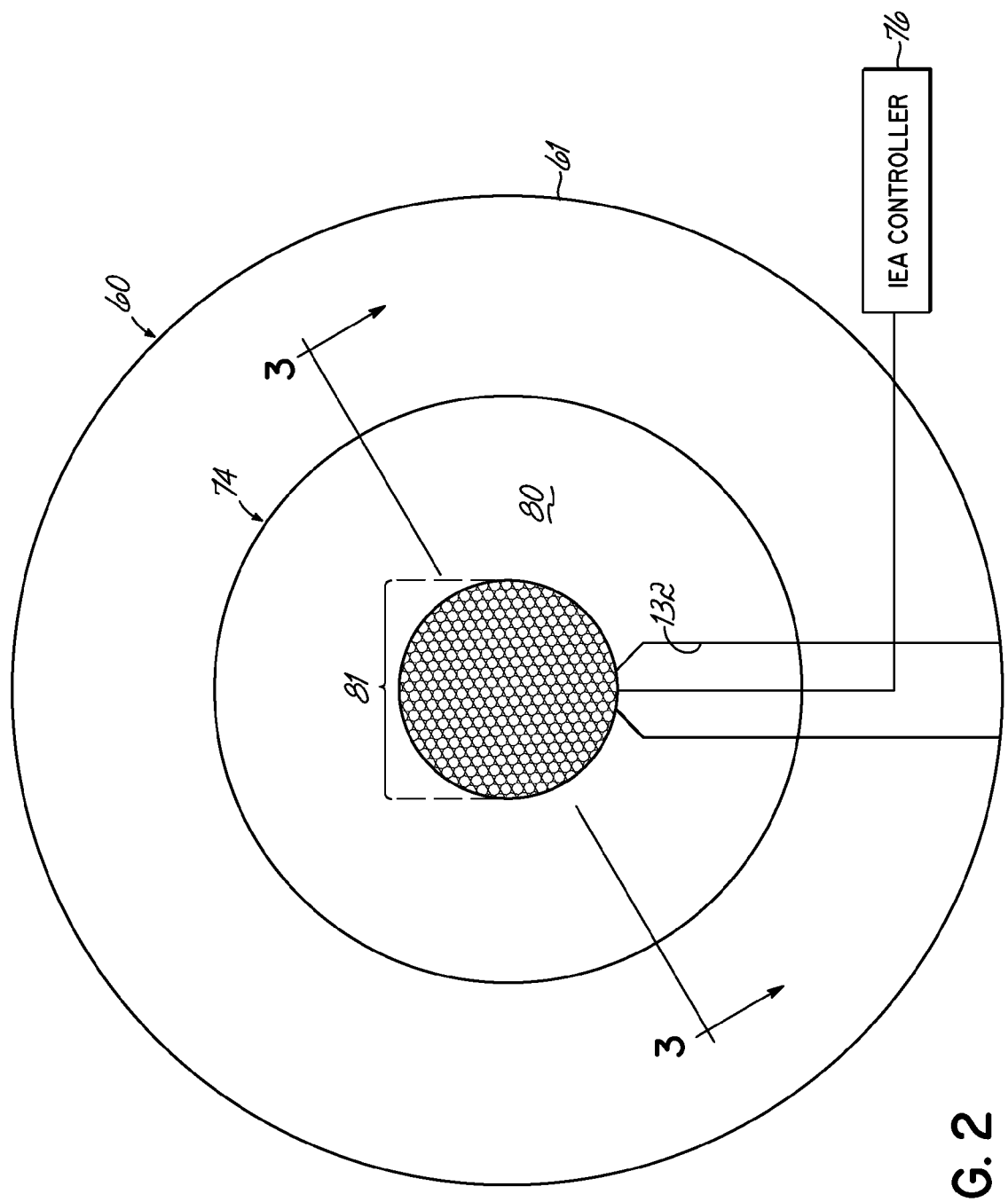
FIG. 2 is a schematic top-view representation of a diagnostic wafer for use in the plasma processing system of FIG. 1 and including an Ion Energy Analyzer ("IEA") in accordance with one embodiment of the present invention.

Turning now to FIG. 2, the diagnostic wafer 60 is shown and described in greater detail. The diagnostic wafer 60 includes a base or carrier substrate 61 (referenced hereafter as "substrate" 61) of any size, including, for example, a 300 mm silicon substrate; however, other sizes (including, about 200 mm to about 450 mm) and materials may also be used. The substrate 61 of the diagnostic wafer includes, or may comprise a portion of, one or more ion energy analyzers ("IEAs") 74, which is configured for use in measuring, evaluating, and/or diagnosing the ion energy distribution ("IED") of ions incident on the diagnostic wafer 60 while the diagnostic wafer 60 is immersed in the plasma 66 and RF biased through the first electrode 52 by first RF power system 62. Each IEA 74 may be operably coupled to an IEA measurement electronics system 76 (hereafter referred to as "IEA controller" 76), which is configured to receive a signal related to IED, as described in greater detail below.

The plasma processing system 50 further comprises a controller 78 that may be operably coupled to one or more of the first RF power system 62, the second RF power system 64, the DC voltage source 70, the DC power system 72, and the IEA controller 76, and may be configured to exchange data with each of these systems. For example, the controller 78 may be configured to receive a signal related to ion current and/or IED, and process this signal in order to determine the state of the plasma 66. In other examples, the controller 78 may be used to correlate a change signal and/or IED with an endpoint of a plasma process (such as plasma etching), including, for example, a fault in the etch process or a plasma instability.

Use of the diagnostic wafer 60 may be implemented with any type of plasma processing system 50. In this illustrative example, the measurement of IED is performed in an RF powered capacitively coupled plasma ("CCP") processing system. However, the diagnostic wafer 60 may also be used in an inductively coupled plasma ("ICP"), a transformer coupled plasma ("TCP"), an electron cyclotron resonance ("ECR") plasma, a helicon wave plasma, a surface wave plasma ("SWP"), which, for example, may be formed using a slotted plane antenna, and so forth.

Referring still to FIG. 2, the IEA 74 is positioned in a generally central region of the substrate 61; however, this position is not necessary as the IEA 74 may be positioned closer to an edge of the substrate 61. If so desired, a second IEA (not shown) may be positioned generally at an edge region of the substrate 61.

Figure 3:
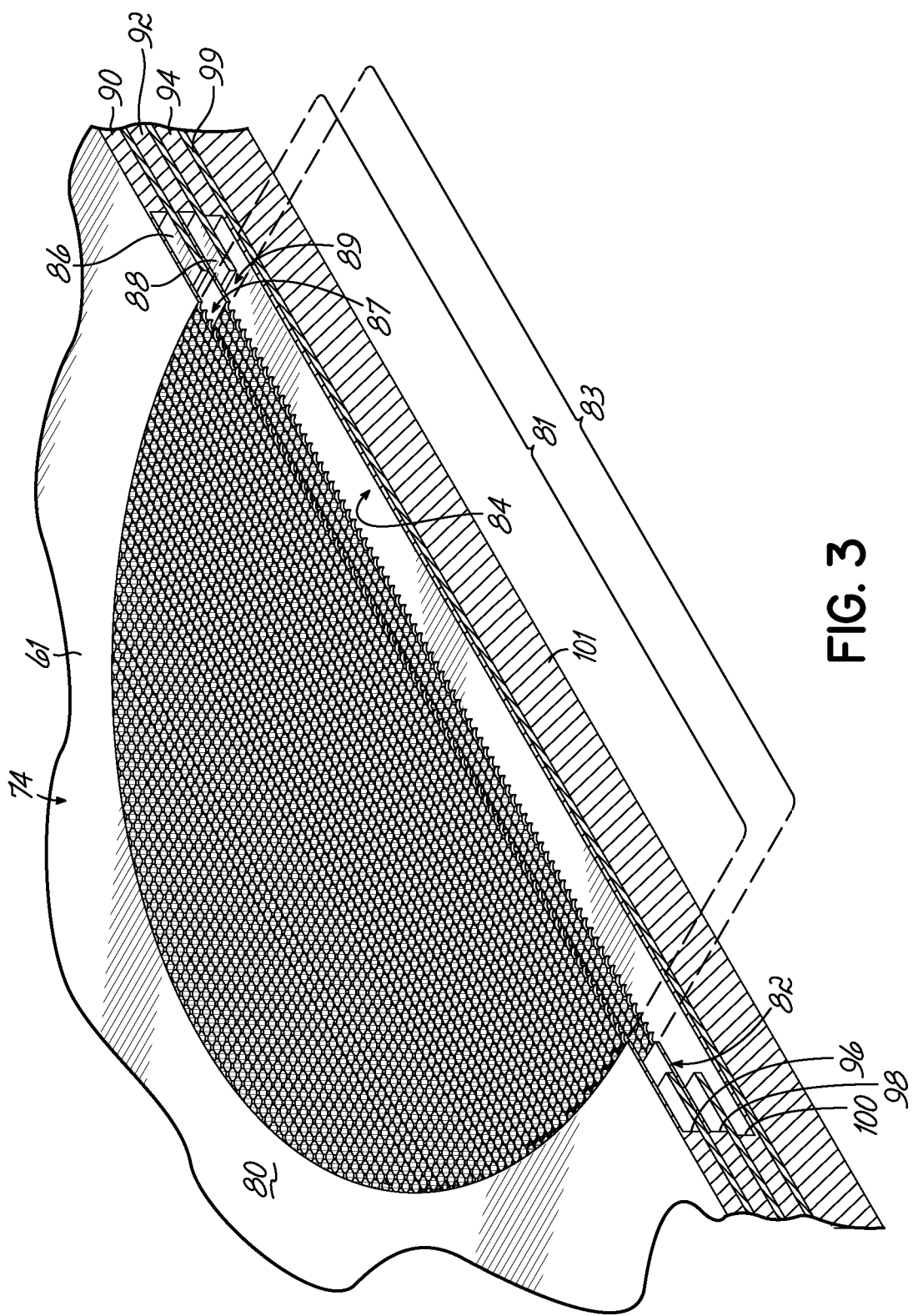
FIG. 3 is a perspective view of the IEA of FIG. 2.
Figure 4:
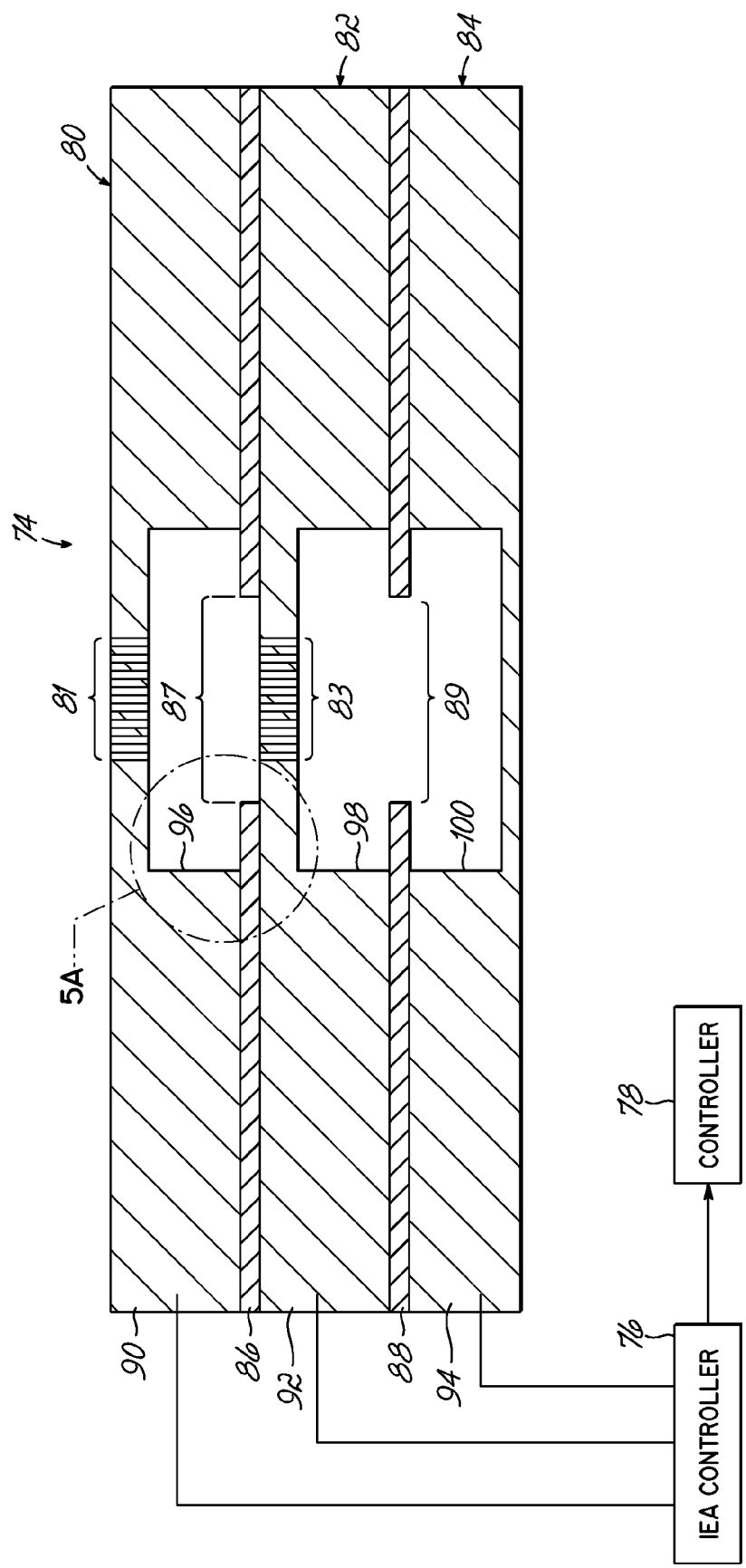
FIG. 4 is a schematic cross-sectional view of the IEA of FIG. 2.

Referring now to FIGS. 3 and 4, with continued reference to FIGS. 1 and 2, the IEA 74 is shown in accordance with one embodiment of the present invention. The IEA 74 generally is an assembly including an entrance grid 80 forming a first surface that is exposed to the plasma 66, an ion selection grid 82 disposed proximate to the entrance grid 80 and opposite the plasma 66, and an ion collector 84 disposed proximate to the selection grid 82, opposite the entrance grid 80, and forming a second surface of the IEA 74.

As is described in greater detail below, each grid 80, 82 and the ion collector 84 may be fabricated on a doped or, alternatively, a phosphorous-doped silicon substrate 90, 92, 94. Moreover, the construction of the diagnostic wafer 60 may be selected to so as to behave as the same RF circuit elements as a corresponding processing wafer. The RF circuit elements may include, for example, conductivity, RF impendence, and so forth. In a particular embodiment, the entrance grid 80 is formed directly onto the diagnostic wafer 60 and other components comprising the IEA 74 are coupled to the entrance grid 80 via the backside of the diagnostic wafer 60. In other embodiments, the entrance grid 80 may be formed in a separate silicon wafer and assembled with the selection grid 82 and the ion collector 84 so as to be positioned in a recess of the silicon wafer and described in greater detail below.

The entrance grid 80 and the selection grid 82 each comprises a central, grid portion 81, 83 having plurality of openings therein, wherein each of the openings has a dimension (for example, a diameter for circular shaped grids; a length or a width for rectangular or square shaped grids; or other shape and appropriate dimension as desired) that is, at most, the Debye length based on the density and electron temperature at the moment that a plasma sheath, which is at a plasma boundary proximate the entrance grid 80, is at its minimum width, which typically occurs at the maximum of the RF swing. Selection of the opening size is necessary to ensure that a plasma sheath, positioned at a boundary of the plasma 66 proximate the IEA 74, remains relatively unperturbed. Furthermore, sub-Debye lengths restrict the plasma sheath's ability to penetrate the entrance grid 80 and to extend into the IEA 74. For the 300 mm diameter wafer and 100 mm diameter IEA noted above, the central grid portions 81, 83 may have a diameter that ranges from about 5 mm to about 20 mm; however, again these dimensions should not be considered to be limiting.

The central, grid portions 81, 83 may also have a thickness for the entrance and selection grids 80, 82, respectively. The thickness may range from about the dimension of the openings (i.e., the Debye length) to about twice the dimension of the openings (i.e., twice the Debye length) so as to provide sufficient material to support electric fields and mechanical strength while minimizing the neutralization of ions passing therethrough.

The substrates 90, 92, 94 comprising the entrance grid 80, selection grid 82, and ion collector 84 are spatially separated by insulators 86, 88 disposed between adjacent ones of the substrates 90, 92, 94. According to one embodiment, the insulators 86, 88 may be constructed from, for example, an aluminate (Al2O3) or sapphire-based material having a thickness that generally ranges from about 30 µm to about 60 µm.

Each insulator 86, 88, like the entrance and selection grids 80, 82, includes a central opening 87, 89 that is substantially in vertical alignment with the central grid portions 81, 83. The central openings 87, 89 have a diameter that meets or exceeds the diameter of the central grid portions 81, 83 of the entrance and selection grids 80, 82. Because of the high voltage potentials applied to the grids 80, 82, 84, the insulators 86, 88 may be subject to electrical breakdown and/or the possibility of flashover occurring between adjacent ones of the grids 80, 82, 84. In that regard, and as more particularly shown in FIGS. 5A and 5B, the insulator material may be configured such that the central openings 87, 89 of the insulators 86, 88 have diameters, which are less than a diameters of channels 96, 98 formed below the central grid portions 81, 83 of the grids 80, 82 but greater than the diameter of the central grid portions 81, 83. Said another way, the insulators 86, 88 project inwardly from the substrates 92, 94 toward a center of the IEA 74. The insulators 86, 88 thus project inwardly from a channel wall with a length of overlap or projection, L, determined to sufficiently bend field lines (shown in dashed lines) extending between the substrates 90, 92, 94 to reduce or prevent flashover before (FIG. 5A) and after (FIG. 5B) charge up.

Comparatively, the conventional length, t, for insulators 86, 88 would be zero. In such instances, there exists a path, along the surface of the insulator 88, 86, connecting the separated conductors (e.g., the grids 80, 82 and the ion collector 84). When an applied, continuous electric field is parallel to the surface of the insulator 86, 88, there is a possibility of breakdown with sufficiently large electric fields. Instead, and as provided in FIGS. 5A and 5B, the length, t, of insulator projects into a region in which the electric field parallel to the surface of the insulator 86, 88 is relatively small, thereby reducing the possibility for surface arc.

Alternatively, and where there exists a set of all possible paths extending along a surface of the insulators 86, 88, the insulators 86, 88 may include a geometry that is selected such that no straight line path exists between two points of the immediately adjacent grids 80, 82, 84, more specifically, with respect to the particular illustrated embodiment, between the entrance grid 80 and the selection grid 82 with respect to the first insulator 86 and the selection grid 82 with the ion collector 84 with respect to the second insulator 88.

Referring again to FIG. 3, the IEA 74 may be capped off with a ceramic spacer 99 and a quartz cover plate 101. The quartz cover plate 101 may be coupled to the entrance grid 80, for example, via one or more bolts 103, which may be constructed from a ceramic-based material. In other embodiments, layers comprising the IEA 74 may be joined by adhesive, etc.

Each of the entrance and selection grids 82, 84 and the ion collector 84 is operably coupled to a respective voltage source 180*a*, 182*a* (FIG. 11) of the IEA controller 76 and the ion collector 84 (FIG. 11) to an ion current meter, illustrated specifically herein as an ammeter 106 (FIG. 1), of the IEA controller 76. In one embodiment this is accomplished via the feed-through system 75 in a wall of the processing chamber 56 (FIG. 1). The first voltage source 180*a* may be operable to apply a constant or alternating bias to the selection grid 82 relative to the entrance grid potential. The second voltage source 182*a* may be operable to apply a negative bias to the ion collector selection grid 84 relative to the entrance grid potential.

Figure 6:
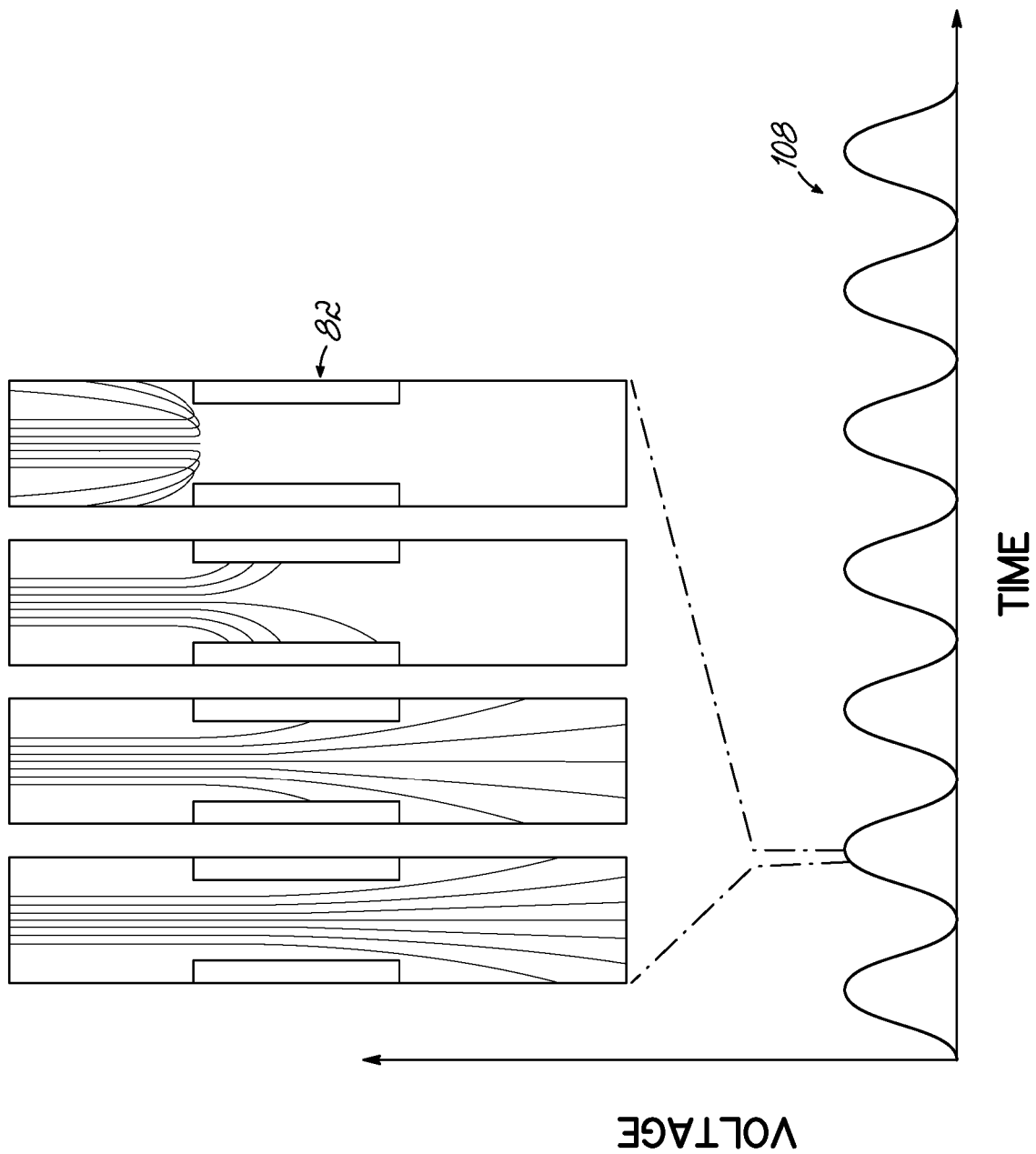
FIG. 6 is a schematic representation of a selection grid of the IEA of FIG. 2 operated in accordance with a waveform and having ion trajectories outlined.

As shown in FIG. 6, a bias potential may be applied to the selection grid 82, for example, by a sinusoidal waveform 108, such that the selection grid 82 is biased between a negative voltage and a positive voltage with respect to the entrance grid 80 (FIG. 2). Other waveforms may be used, including, for example, a triangular waveform. The voltage potential of the selection grid 82 (FIG. 2) relative to the entrance grid 80 is operable to determine a minimum ion energy (and charge) for ions passing through the plurality of holes in the central, grid portion 83 (FIG. 3) of the selection grid 82 (FIG. 3) and reaching the ion collector 84 (FIG. 3). Alternatively, ions of a first selected energy may be turned away from the selection grid 82 (FIG. 3), e.g., repelled, at some grid voltages while ions of second selected energy will traverse the plurality of holes in the central, grid portion 83 (FIG. 3) of the selection grid 82 (FIG. 3) at a somewhat lower voltage to be recorded at the ion collector 84 (FIG. 3), with higher probability, at even lower selection grid voltages.

The exemplary illustration of FIG. 6 shows ion trajectories for high energy ions at different time points along the waveform 108. The intermediate voltage range, during which there is a partial transmission of ions, represents one of the limits on the resolution of an ion energy analyzer in accordance with one embodiment of the present invention.

Figure 7:
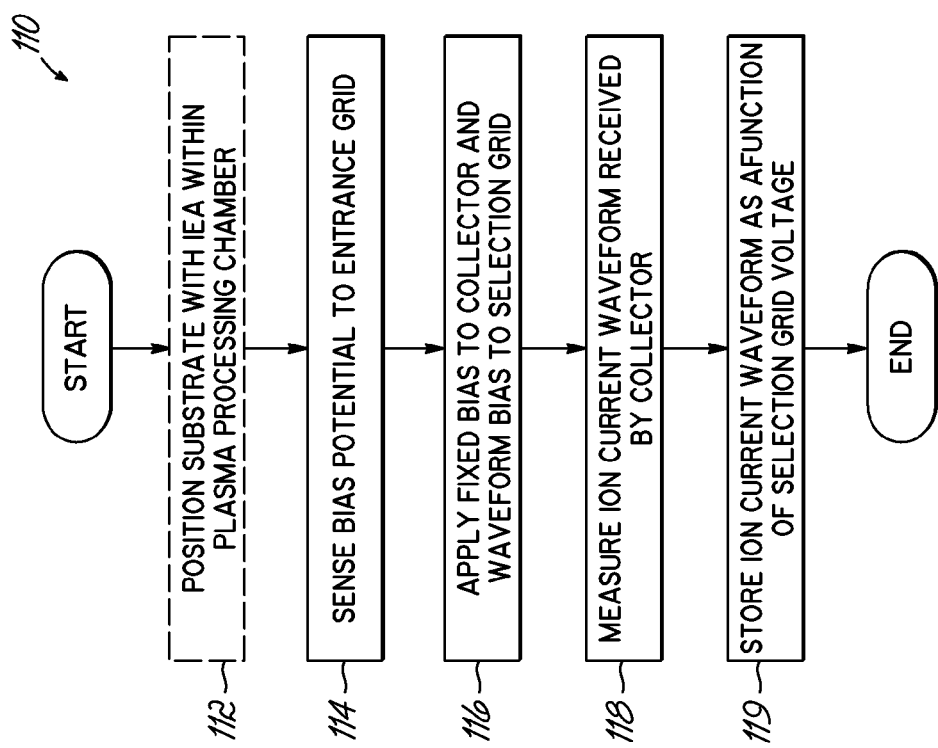
FIG. 7 is a flow chart illustrating a method of operating the IEA of FIG. 2 in accordance with one embodiment of the present invention.

FIG. 7 is a flowchart 110 illustrating one method of using the plasma processing system 50 in accordance with one embodiment of the present invention, with reference also to FIGS. 1 and 3. In this particular embodiment the voltage of the entrance grid 80 (FIG. 2) is sensed and a magnitude of the voltage applied to the selection grid 82 (FIG. 3) and the ion collector 84 (FIG. 3) are referenced to this sensed voltage rather than the chamber ground or other reference voltage. In optional Step 112, the diagnostic wafer 60 having the IEA 74 incorporated therein is positioned within the processing chamber 56; however, as described in greater detail below, the location of the IEA 74 need not be limited to the diagnostic wafer 60, but may, instead, be included on a processing wafer or on a plasma-exposed surface of a diagnostic system. A desired fraction of the ion flux is selected to reach the ion collector 84 by determining an ion voltage for the selection grid 82 and, in that regard, in Step 114, the floating potential of the entrance grid 80 is sensed and used as a reference voltage for the selection grid and ion collector voltages. The ion collector 84, being coupled to a voltage source 180a (FIG. 11) is configured to negatively bias the ion collector 84. The ion selection voltage may comprise a positive DC voltage ranging from about 0 V to a value that is equal to the maximum ion energy. The range of the ion selection voltage is selected to be sufficiently wide to permit discrimination of the full range of ion energies for ions passing through the plasma sheath at the plasma boundary and entering the IEA 74 through entrance grid 80.

In Step 116, a time-varying waveform for voltage is applied to the selection grid 82 and the ion current flux received at the ion collector 84 is measured in Step 118. The voltage source 180a (FIG. 11) is electrically coupled to the selection grid 82 may comprise a variable DC voltage source configured to bias the ion collector 84 with a negative DC ion selection voltage. The variable DC voltage source is configured to scan the ion selection voltage by varying the ion selection voltage between a first voltage value and a second voltage value. The ion selection voltage may be referenced to the floating potential on the entrance grid 80 or to ground, as described in detail below.

In Step 119, the measured ion current is stored as a function of the time-varying ion selection voltage of the selection grid 82. In that regard, the ammeter 106 is coupled to the ion collector 84 to measure the ion current. The ammeter 106 may comprise an operational amplifier (op-amp) or other device as would be understood by those of ordinary skill in the art.

The IEA controller 76 is configured to, among other things, receive a signal related to a selected ion current at the ion collector 84, process the signal, store the signal, and assemble the IED for the plasma subject to diagnosis. In those embodiments in which a more than one IEA 74 is immersed in plasma, the IED may be measured by varying the potential on the selection grid 82, and monitoring the ion current associated with those ions having sufficient energy to overcome the potential barrier imposed by the ion collector 84 and strike the ion collector 84. By collecting and measuring the selected ion current as a function of the potential on the ion collector 84, an integrated form of the IED may be acquired. Differentiation of this integral leads to the IED.

In accordance to another embodiment of the present invention, the IEA controller 76 may be configured to set a sweeping output level to bias the ion collector 84 via the voltage source 182a (FIG. 11) and to negatively bias the selection grid 82 to a fixed negative voltage, both voltages being relative to a detected potential of the entrance grid 80. The negative bias of the selection grid 82 is operable to repel electrons entering the entrance grid 80 while a varying positive potential applied to the ion collector 84 is operable to repel those ions having energies that are lower than the collector potential, relative to the entrance grid. The ion collector current, as a function of the ion collector voltage, may be differentiated to give the IED.

In some instances, the availability, costs, or other external influences may require that the amount of material (such as the doped silicon) comprising the entrance grid be reduced. In particular, the cost associated with forming an entrance grid directly into the substrate may become quite high. Therefore, limiting the amount of substrate material necessary for the entrance grid formation may be beneficial.

Figure 8:
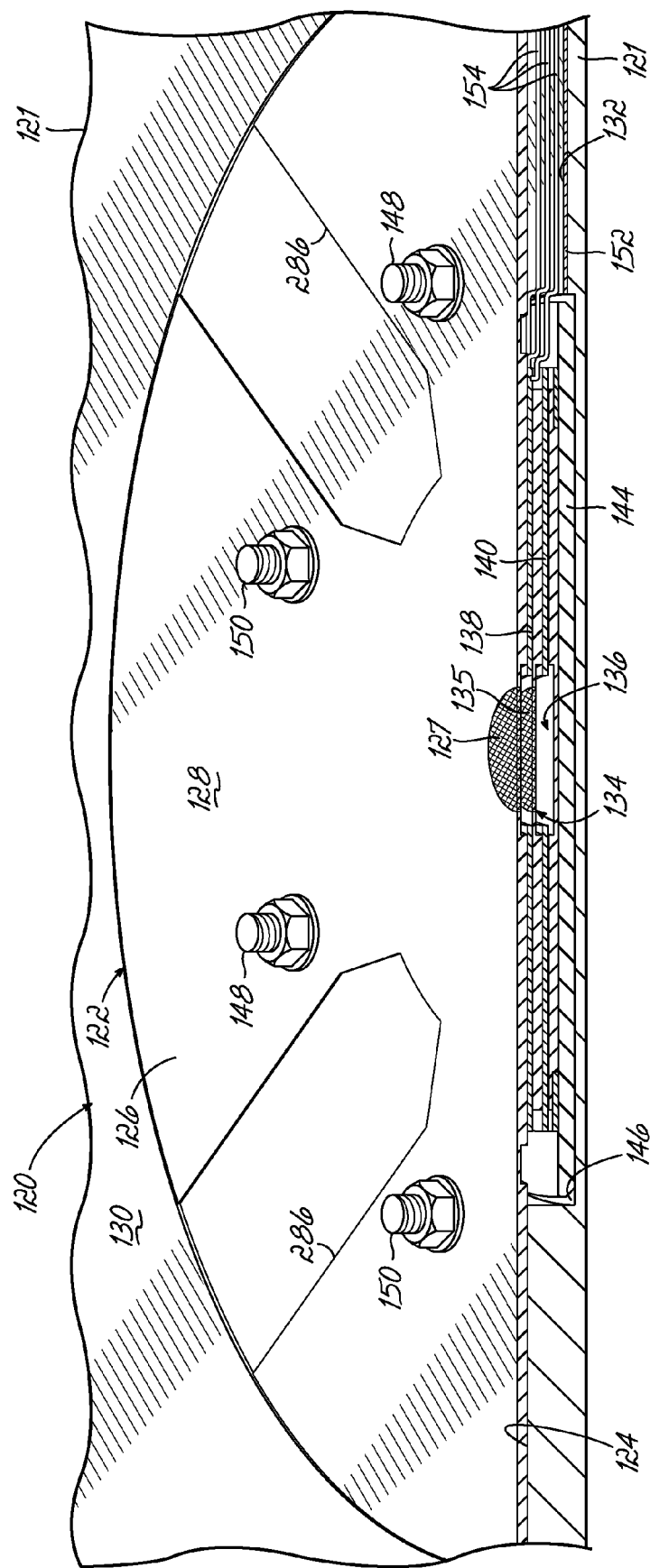
FIG. 8 is a perspective view of an IEA in accordance with another embodiment of the present invention.
Figure 9:
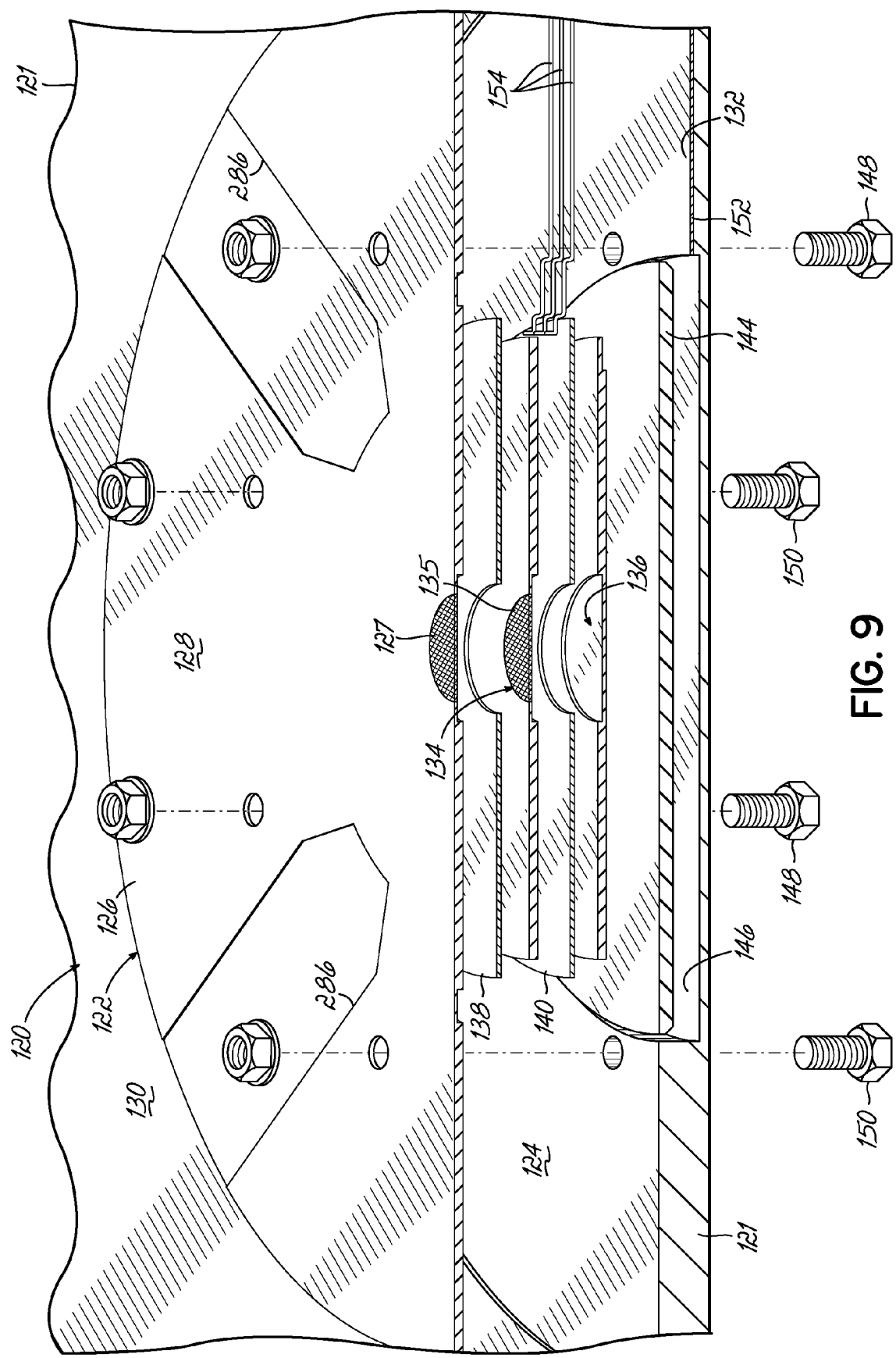
FIG. 9 is an exploded, perspective view of the IEA shown in FIG. 8.

In that regard, and with reference now to FIGS. 8 and 9, a diagnostic wafer 120 having an IEA 122 in accordance with another embodiment of the present invention is shown. The diagnostic wafer 120 includes a recessed portion 124 therein that is shaped and sized to receive the IEA 122 therein and such that an exposed surface 128 of an entrance grid 126, having openings 127 therein, is co-planar with an exposed surface 130 of the diagnostic wafer 120. A recessed track 132 extends radially outwardly from the recessed portion 124 and is configured to contain electrical components operatively associated with the IEA 122 as described in greater detail below.

The dimensions of the entrance grid 126 need to be sufficiently large so as to provide good capacitive coupling between the entrance grid 126 and the underlying substrate 121 of the diagnostic wafer 120. Good capacitive coupling between the entrance grid 126 and the underlying substrate 121 is necessary so that the RF impedance between the entrance grid 126 and the substrate 1221 is less than the RF impedance between the entrance grid 126 and ground in the case that a wire connects the entrance grid 126 to the outside world through a feed-through 75 system (FIG. 1) in the chamber wall. For example, the IEA 122 of a 300 mm diameter silicon wafer used in constructing the entrance grid 126 may have a diameter that is approximately 100 mm while the diameters of silicon wafers used in constructing the selection grid 134 (with openings 135 extending therethrough) and/or the ion collector 136 may be less than 100 mm to further reduce material costs. Generally, the thickness of the substrate material used in constructing the entrance and selection grids 126, 134 and the ion collector 136 may vary from about 10 nm to about 500 nm.

The grids 126, 134 and the ion collector 136 are again separated by first and second insulators 138, 140 constructed in a manner that was described in detail above. The IEA 122 may be held together with a quartz cover plate 144, the latter of which being received within a further recessed portion 146 of the wafer 120 and the assembly coupled together via one or more bolts 148, which may be constructed from a ceramic-based material. Still other bolts 150 may be used to couple the IEA 122 to the diagnostic wafer 120.

A ceramic spacer 152 may be included to insulate electrical couplings, i.e., wires 154, from the silicon diagnostic wafer 120.

Use of the diagnostic wafer 120 as described herein may be similar to the method described previously with respect to FIG. 7.

Figure 10:
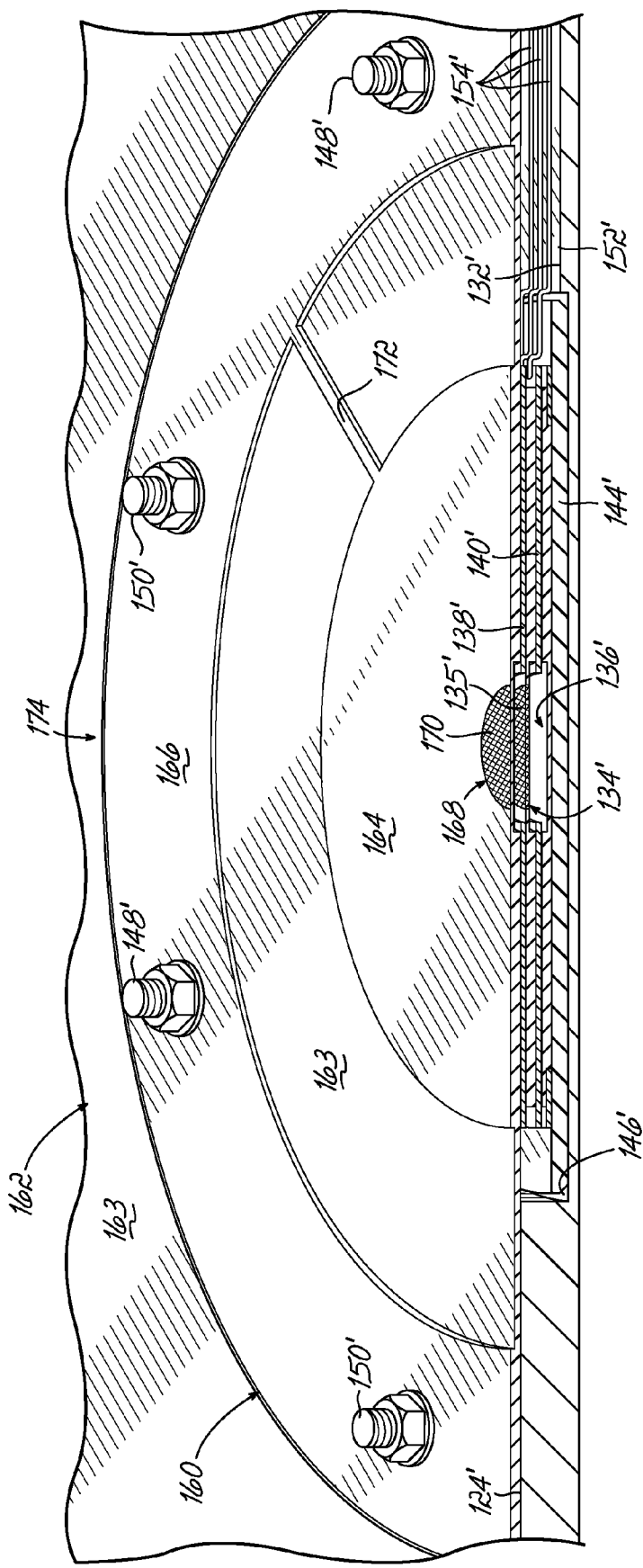
FIG. 10 is a perspective view of an IEA in accordance with another embodiment of the present invention.

In still other processing methods, further restrictions in the amount of substrate material used in forming the entrance grid may be necessary. As a result, and as shown in FIG. 10, an entrance grid 160 for use with a diagnostic wafer 162 comprising a silicon substrate 163 in accordance with another embodiment of the present invention is shown and described. The entrance grid 160 again comprises a doped silicon substrate material that may be similar to those described previously, divided into a first segment 164 and a second segment 166. In the particular illustrative embodiment, the first segment 164 includes a central, grid portion 168 having a plurality of openings 170 therein and the second segment 166 is positioned concentrically with the first segment 164. However, other arrangements and shapes may also be used.

The first and second segments 164, 166 are coupled via a lead 172 such that, together, the first and second segments 164, 166 act as a single body, electrically. As a result, the overall area of the first and second segments 164, 166 is sufficiently large as to provide good capacitive, RF coupling between the first and second segments, collectively, and the diagnostic wafer 162. Related techniques may be used to enhance the RF coupling of any of the grids to the diagnostic wafer 162

It would be understood that the lead 172 may be a conductive wire or other known devices.

The remaining components comprising the IEA 174 of FIG. 10 may be similar to those described above with reference to FIG. 8 and indeed, like reference numerals having primes thereafter designate corresponding components of the embodiments.

From the description herein, those of ordinary skill in the art would readily appreciate that a variety of electrical circuit embodiments may comprise the IEA controller 76 (FIG. 1). Yet, some circuit diagrams may be more beneficial than others, for example, those that minimize the number of electrical connections by ganging one or more of the grids. Accordingly, various embodiments of IEA controller configuration are described; however, the electrical diagrams described herein should not be considered limiting as any number of circuits may be implemented by one of ordinary skill in the art.

Figure 11:
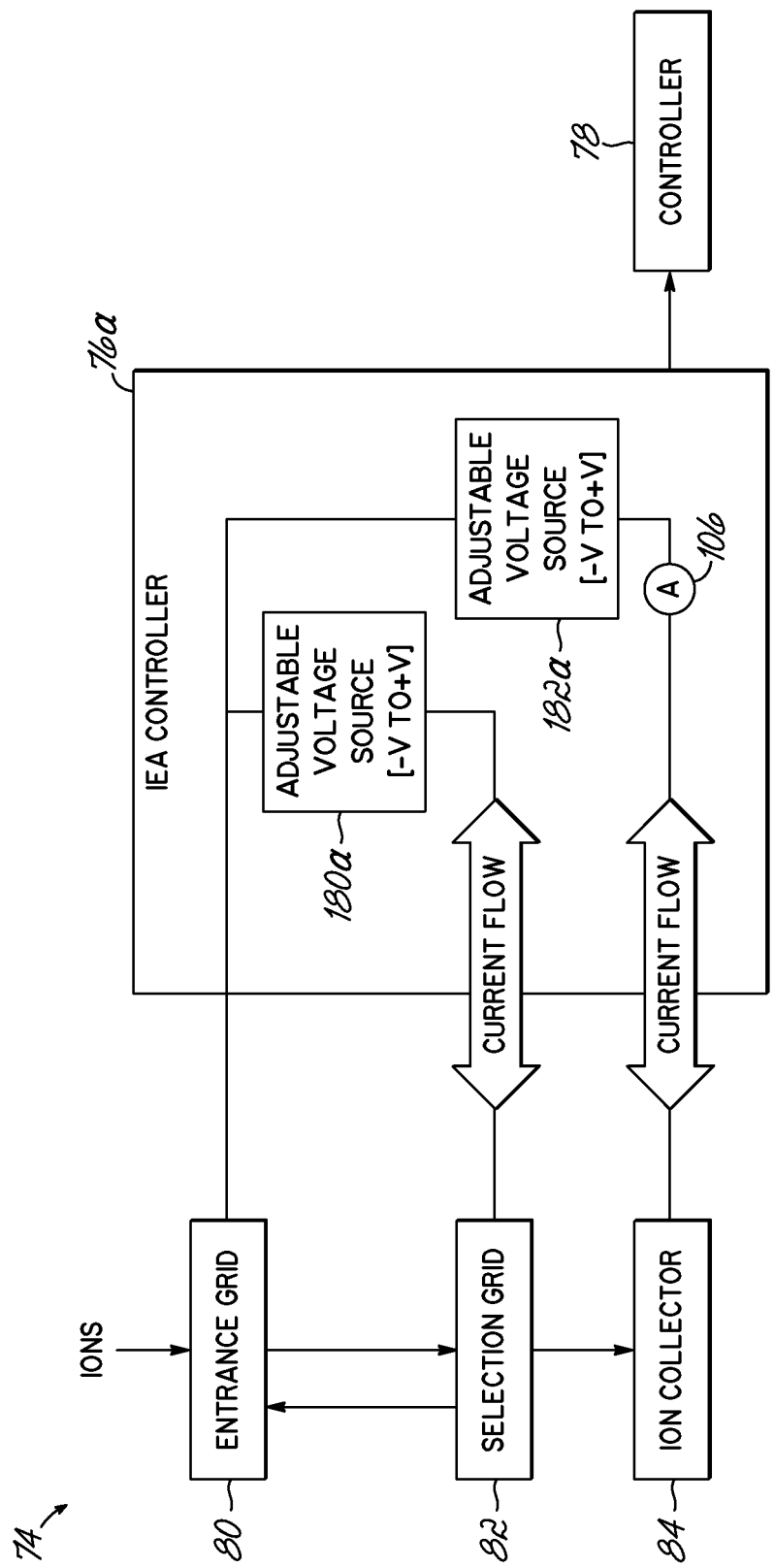
FIG. 11 is a schematic representation of an IEA with an IEA controller configured to power embodiments of a three-layer IEA in accordance with one embodiment of the present invention.

In making reference now to FIG. 11, an IEA controller 76a is described in accordance with one such embodiment. Specifically, the IEA controller 76a is suitable for use with relatively-biased plasmas in which the plasma potential is variable. In that regard, the bias potential across entrance grid 80 is determined, at least in part, by the plasma potential. The IEA controller 76a is electrically coupled to the entrance grid 80, the selection grid 82, and the ion collector 84 of the IEA 74. In that regard, a first adjustable voltage source 180 within the IEA controller 76a is configured to selectively bias the selection grid 82 with respect to the entrance grid 80. A second adjustable voltage source 182 within the IEA controller 76a is configured to selectively bias the ion collector 84 relative to the entrance grid 80. Generally each voltage source 180, 182 is configured to apply a voltage potential ranging from −V to +V and may be constructed in a variety of methods. According to one embodiment, one or both of the voltage sources 180, 182 may comprise a first voltage generator in series with a second, variable voltage generator of opposing polarity. For example, the first voltage generator may be configured to apply a positive bias between two electrodes while the second, variable voltage generator selectively and negatively biases the two electrodes so as to be less positive or even negative.

The ammeter 106 is electrically coupled to the ion collector 84 and is configured to measure an electrical current flow resulting from ions having sufficient energy impacting the ion collector 84. A signal representing the measured, resultant electrical current may be transmitted, via hard wire connection or wirelessly, to the controller 78 for processing.

Figure 12:
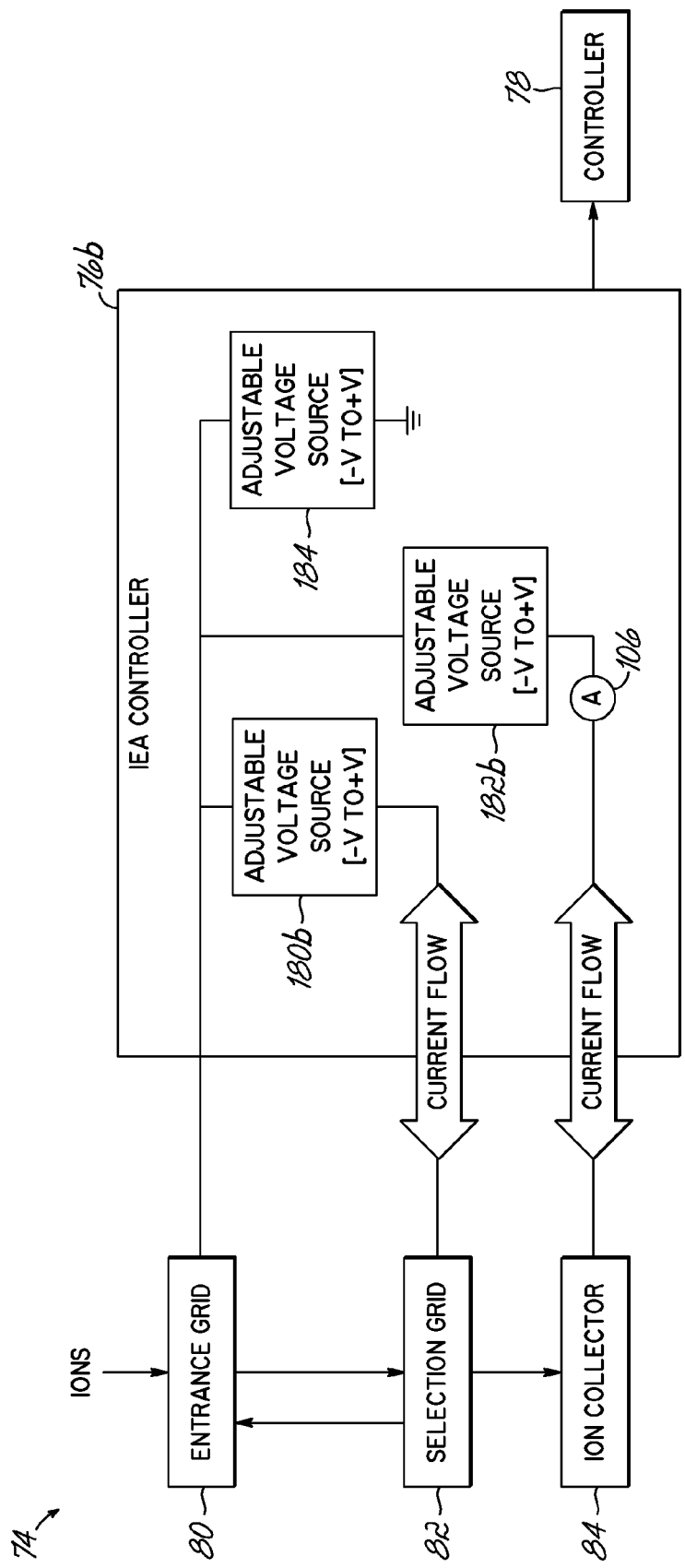
FIG. 12 is a schematic representation of an IEA with an IEA controller configured to power embodiments of a three-layer IEA in accordance with one embodiment of the present invention.

In certain plasma conditions, the entrance grid floating voltage may be measured and then biased relative to a reference voltage, such as ground, accordance with another embodiment of the present invention as shown in FIG. 12. In addition to the first and second voltage source 180a, 182a that are similar to those described above with reference to FIG. 11, a third voltage source 184 may electrically couple, in parallel, the IEA controller 76b to ground.

If desired, another ion current meter may be provided between the selection grid 82 and the adjustable voltage source 180a. The ion current detected from the selection grid 80 may be used in determining the IED or for evaluating a performance of the IEA, generally.

Figure 13:
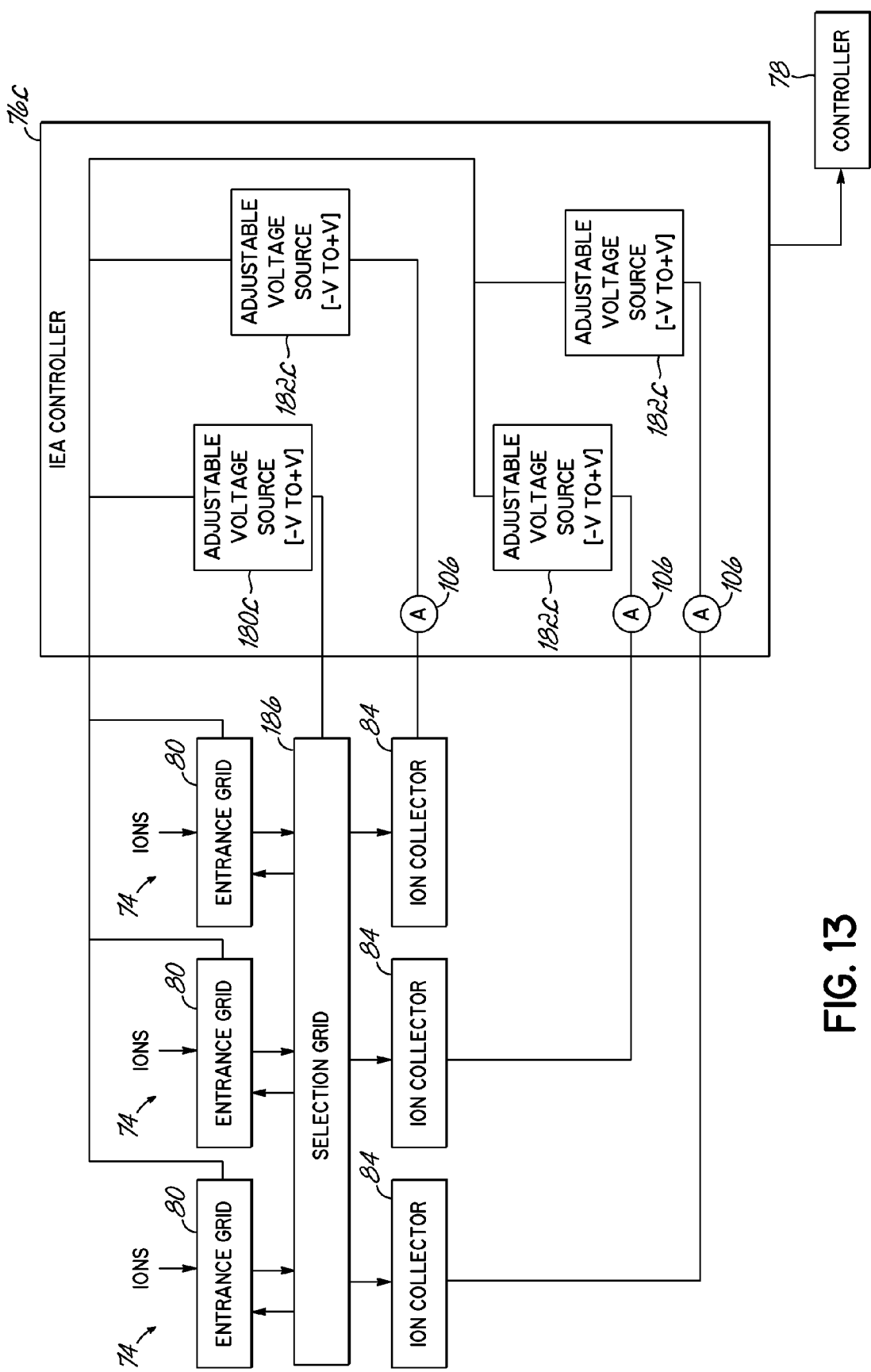
FIG. 13 is a schematic representation of an IEA controller configured to power embodiments of a diagnostic wafer having a plurality of three-layer IEAs thereon and sharing a common scanning grid in accordance with certain embodiments of the present invention.

In those embodiments in which a diagnostic wafer includes a plurality of IEAs 74, it may be beneficial to incorporate a single selection grid 186 for all IEAs 74. FIG. 13 illustrates one such embodiment of the present invention. The IEA controller 76c again includes a first voltage source 180b applying a voltage between each entrance grid 80 and a unitary selection grid 186. Separate ammeters 106 in series with second voltage sources 182b electrically couple the ion collectors 84 with the entrance grids 80. As shown, the IEAs 74 are further coupled to an internal ground source, which here may be the diagnostic wafer 60.

While FIG. 13 illustrates the voltage sources 182b being combined within a single IEA controller 76c, it would be readily appreciated that this is for illustrative convenience only and, in fact, in some embodiments a separate IEA controller may be operably coupled to each IEA and including only one set of voltage sources 180, 182 therein.

Figure 14:
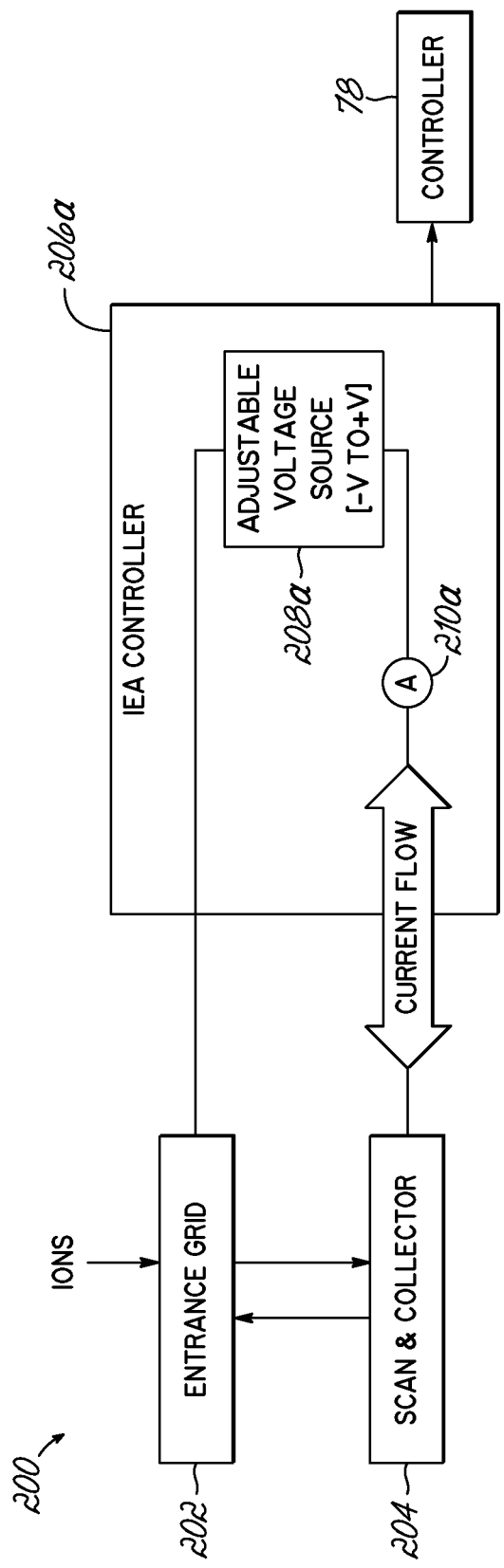
FIG. 14 is a schematic representation of an IEA with an IEA controller configured to power embodiments of a two-layer IEA suitable for powering embodiments of two-layer IEA in accordance with one embodiment of the present invention.
Figure 14A:
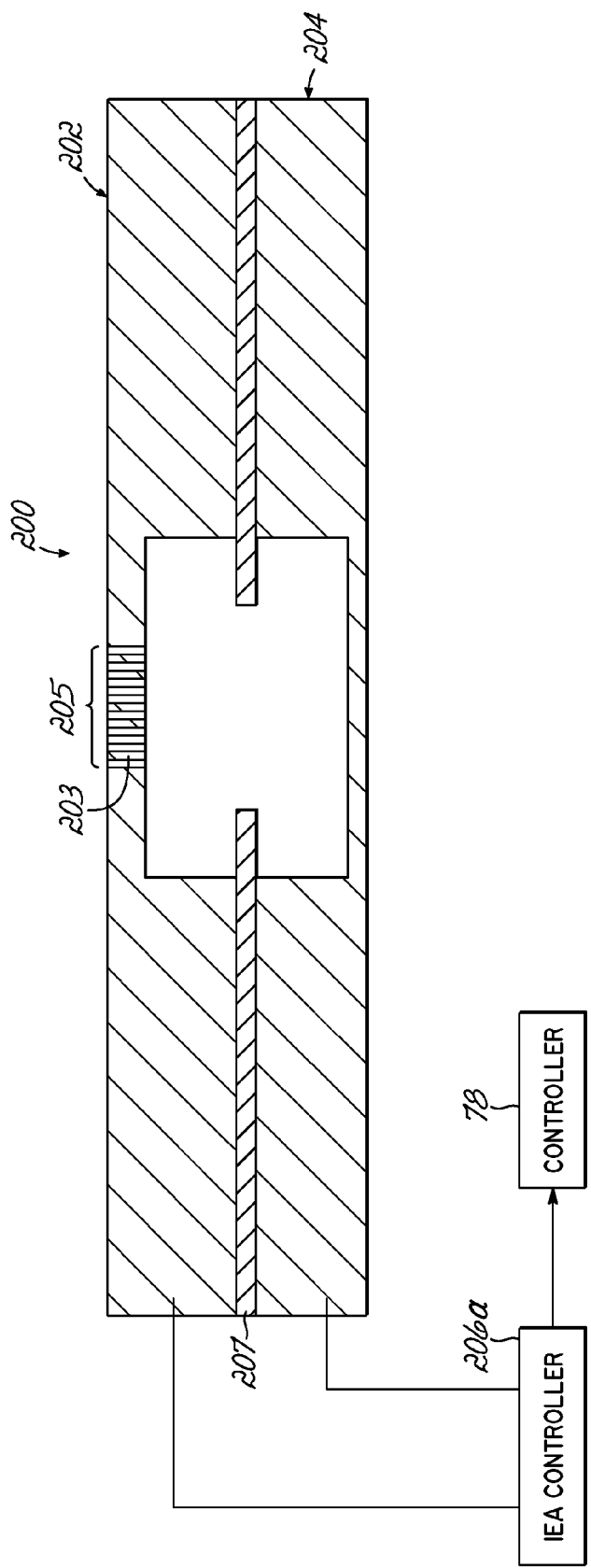
FIG. 14A is a schematic cross-sectional view of the two-layer IEA of FIG. 14.

The embodiments of the present invention have thus far included separate selection grid and ion collector; however, the functions performed by these separate components may be combined into a single unit. For example, and with reference now to FIGS. 14 and 14A, an IEA 200 in accordance with another embodiment of the present invention is schematically shown with one embodiment of an IEA controller 206a. The IEA 200 includes an entrance grid 202 and collector 204, electrically isolated from the entrance grid 202 by an insulator 207 that is operable to selectively collect ions of a predetermine energy range.

The collector 204 is biased with respect to the entrance grid, which has a floating potential, by an adjustable voltage source 208a, which may be configured in a manner that is similar to the adjustable voltage sources 180, 182 (FIG. 11) described above. An ammeter 210a is electrically coupled to the collector 204 and is configured to measure an electrical current flow resulting from ions having sufficient energy impacting the collector 204. A signal representing the measured, resultant electrical current may be transmitted, via hard wire connection or wirelessly, from the ammeter 210 to a processor 189 of the controller 78 for processing.

The IEA 200 not only reduces the amount of material, particularly the doped silicon, necessary for construction of the IEA 200, but also reduces the complexity of the electrical connections, and isolation thereof, between the IEA 200 and the IEA controller 206a.

In use, the IEA 200 may be configured to operate as an ion current probe. In this configuration, the ion collector 204 may measure total ion current. More specifically, the ion collector 204 may be biased negative relative to the entrance grid 202 (having a plurality of openings 203 in a central, grid portion 205) and the ion current is measured by impacting the ion collector 204. With a waveform, such as was described with reference to FIG. 6, applied to the ion collector 204, an IED may be determined using a single grid and a single collector, making this arrangement a small and simple configuration.

Figure 15:
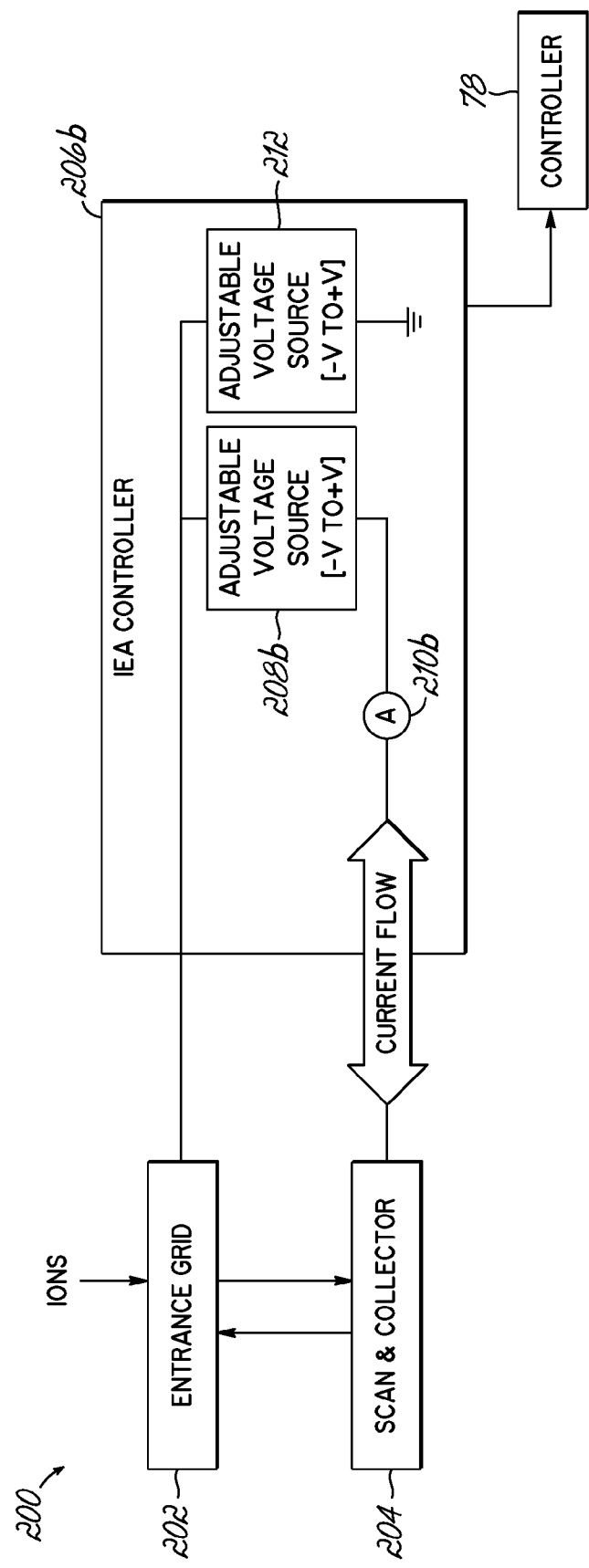
FIG. 15 is a schematic representation of an IEA with an IEA controller configured to power embodiments of a two-layer IEA suitable for powering embodiments of two-layer IEA in accordance with one embodiment of the present invention.

FIG. 15 illustrates the IEA 200 having an IEA controller 206b that is electrically configured for use with a constant biased entrance grid 202. Specifically, in addition to the adjustable voltage source 208b, another adjustable voltage source 212 may electrically couple, in parallel, the IEA 200 to ground.

Figure 16:
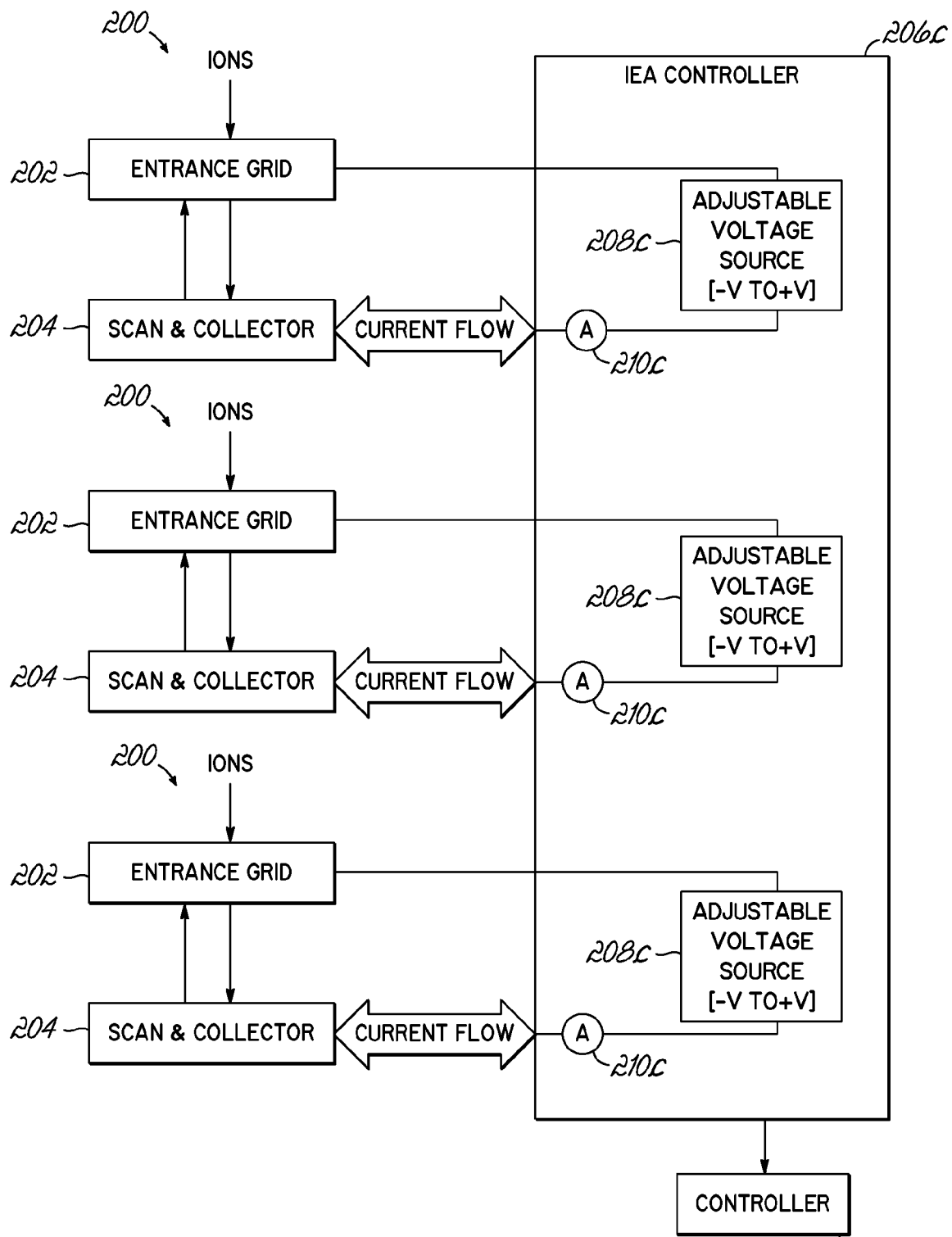
FIG. 16 is a schematic representation of an IEA controller suitable for powering a diagnostic wafer having a plurality of two-layer IEAs thereon and in accordance with one embodiment of the present invention.
Figure 17:
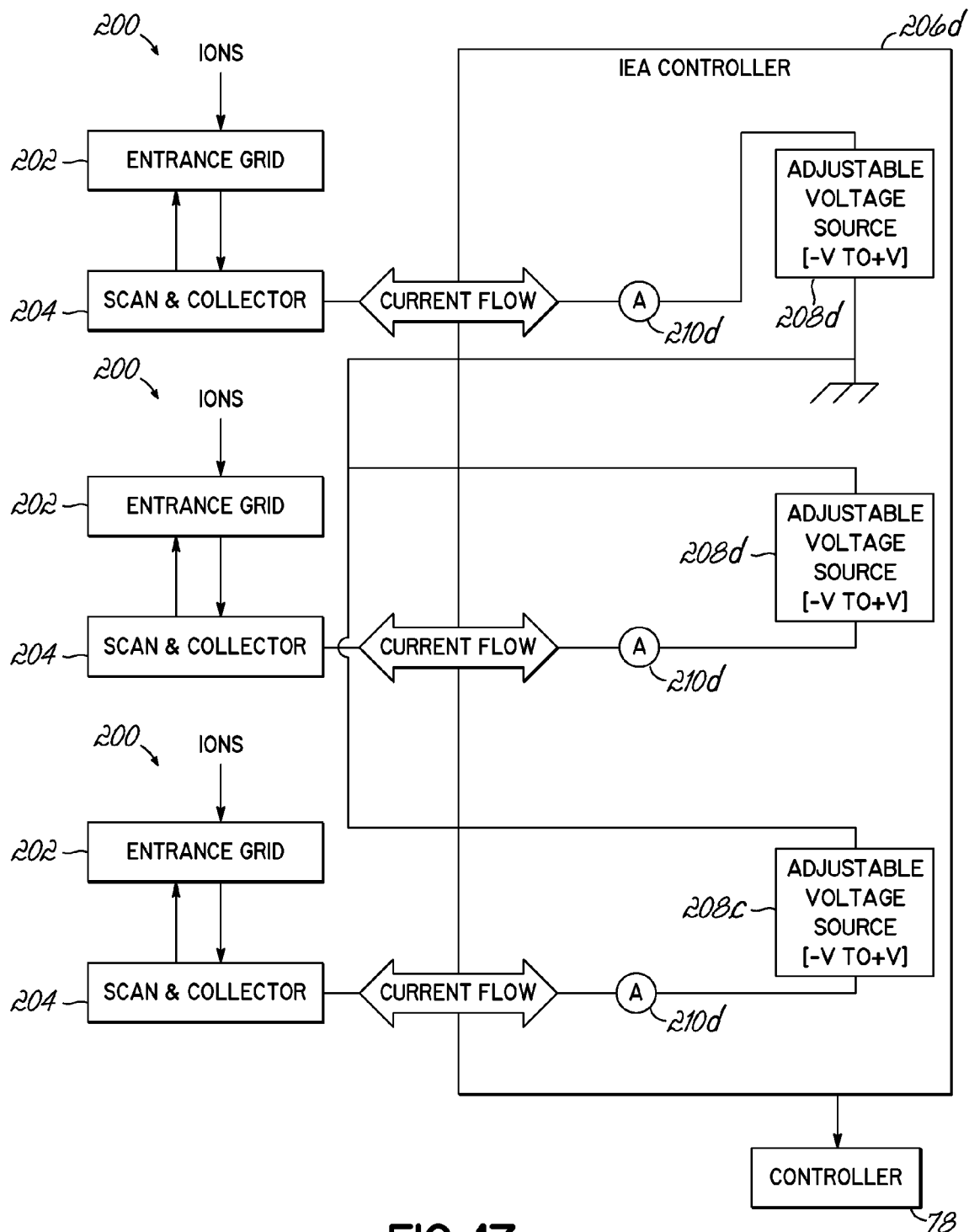
FIG. 17 is a schematic representation of an IEA controller suitable for powering a diagnostic wafer having a plurality of two-layer IEAs thereon and in accordance with another embodiment of the present invention.

FIGS. 16 and 17 illustrate two electrical configurations in which a diagnostic wafer includes a plurality of IEAs 200. Although three IEAs are shown, it would be readily appreciated that the number illustrated should not be considered to be limiting. In FIG. 16, the IEA controller 206c is configured such that each IEA 200 of the plurality has a separate adjustable voltage source 208c and ammeter 210c combination. A signal representing the measured, resultant electrical current may be transmitted and distinguished. Therefore, the IED may be determined at a plurality of locations of the diagnostic wafer. As was noted above, while the voltage sources 208c are illustrated to be provided within the same IEA controller 206c, this is not requires as each IEA 200 may be operable coupled to a separate IEA controller 206.

FIG. 17 is similar in that each IEA 200 and includes a separate adjustable voltage source 208d and ammeter 210d, the IEA controller 206d is not directly, electrically coupled to the entrance grids 202 as are the IEA 206d. Instead, the IEAs 200 are coupled to an internal ground source, near the substrate 61.

Transferring the electrical current measurements from the ammeter within an environment operating a high voltage potentials and RF energies to the IEA controller for IED that is often grounded and at much lower voltage potentials has conventionally been difficult. That is, a series of RF filters may be disposed between each grid and the IEA controller 76 in order to provide a high input impedance for the RF voltage at one or more RF frequencies on each grid. One way in which the electrical currents are transferred, a feed-through system 75, is shown and described with reference to FIGS. 18 and 19 in accordance with one embodiment of the present invention is shown.

Figure 18:
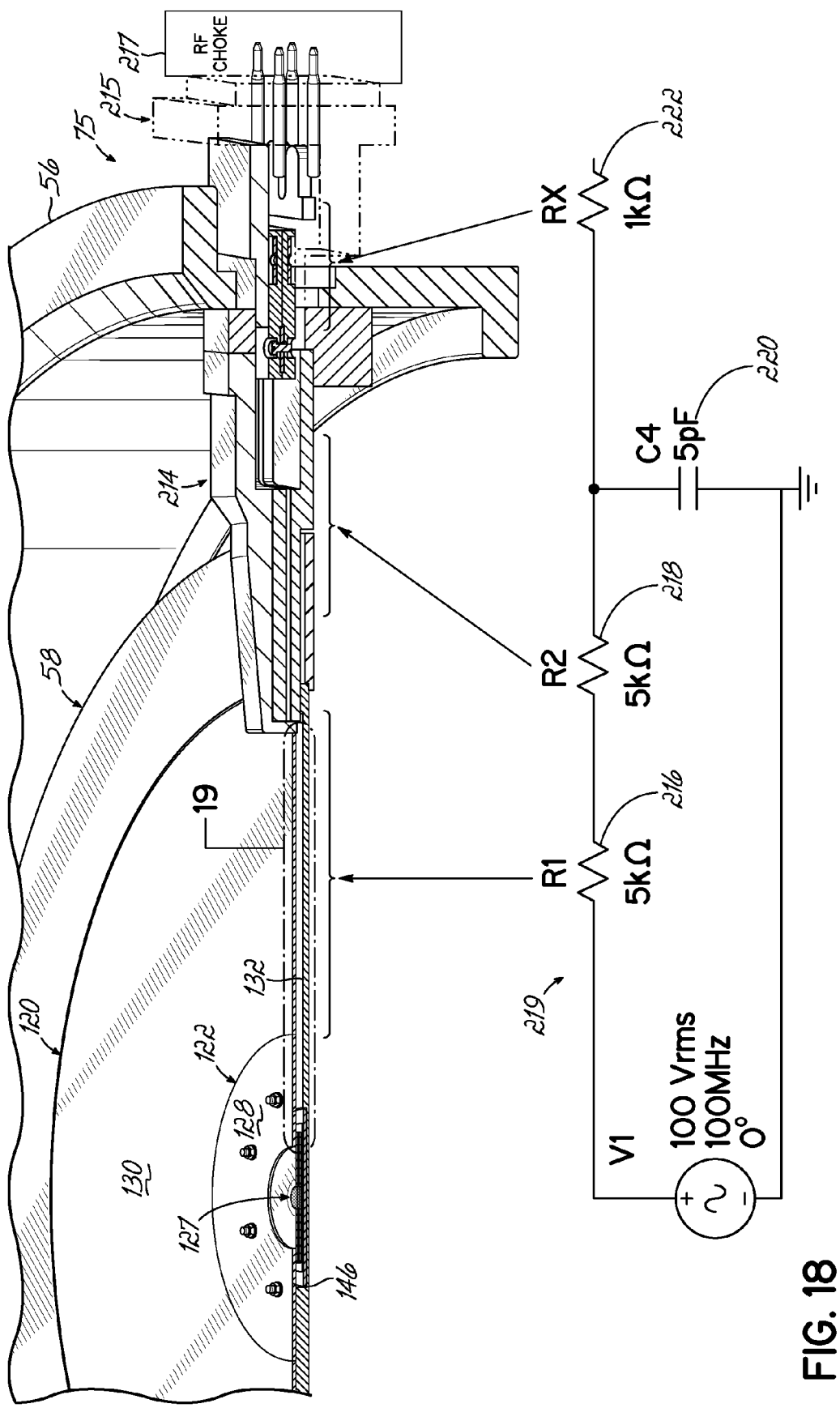
FIG. 18 is a perspective view of a feed-through system of the plasma processing system of FIG. 1 in accordance with one embodiment of the present invention.
Figure 19:
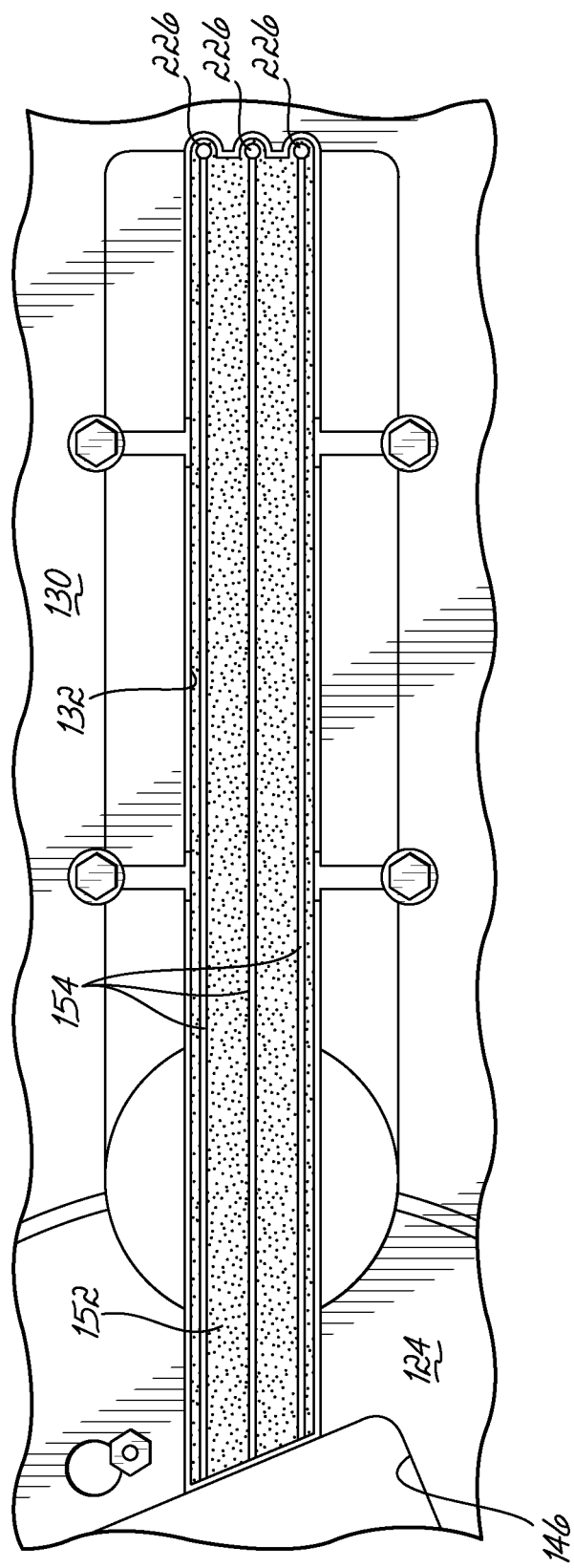
FIG. 19 is a schematic top view of a portion of the feed-through system shown of FIG. 18.

In FIG. 18, the feed-through system 75 includes a bridge 214, the feed-through 215, and an RF choke 217. The bridge 214 is configured to isolate the electrical connections made between the IEA 122 and the IEA controller 76 (FIG. 1) from the diagnostic wafer 120 and the plasma 66 (FIG. 1). The bridge 214 is interfaced with the RF choke 217 via the feed-through 215, which reduces the RF voltage picked up by the IEA 122 and that may cause RF current to flow to the chamber ground as the wire connection pass through the chamber wall. Finally, the RF choke 217 restricts movement of high frequency alternating current remaining away from the processing chamber 56 (FIG. 1) while permitting lower frequency alternating current and direct currents, of which the electrical current indicative of IED is included.

To further facilitate the filtering of high frequency AC and high RF voltage signals, an RC-circuit 219 may be introduced to the feed-through system 75. For example, each RF filter 216, 218 may comprise a notch or band-pass filter, or a low-pass filter constructed from ruthenium oxide ($RuO_2$) on aluminum oxide ($Al_2O_3$). By implementing a $RuO_2$ resistor 216, 218 for each of the entrance grid 126 (FIG. 8) and the selection grid 134 (FIG. 8), one within the diagnostic wafer 120 and one within the bridge 214, each being configured to provide about 5 kΩ of resistance, for example, then the voltage may be sufficiently decreased before reaching the wall of the processing chamber 56 (FIG. 1).

A series of RF filters may be disposed between each grid and the IEA controller 76 (FIG. 1) in order to provide a high input impedance for the RF voltage at one or more RF frequencies on each of the grids 126, 134 (FIG. 8) and the ion collector 136 (FIG. 8). The IEA 122 may comprise a first RF filter disposed between the entrance grid 126 (FIG. 8) and the IEA controller 76 (FIG. 1), a second RF filter disposed between the selection grid 134 (FIG. 8) and the IEA controller 76 (FIG. 1), and a third RF filter disposed between the ion collector 136 (FIG. 8) and the IEA controller 76 (FIG. 1). For example, each RF filter may comprise a notch or band-pass filter, or a low-pass filter Though not specifically shown, in those embodiments in which a tuned circuit is necessary, an inductor may be incorporated within the electrical connection. In one embodiment, the inductance may be limited to 100 MHz of ferrite and may be positioned between the resistors described with reference to FIG. 18.

Figure 20:
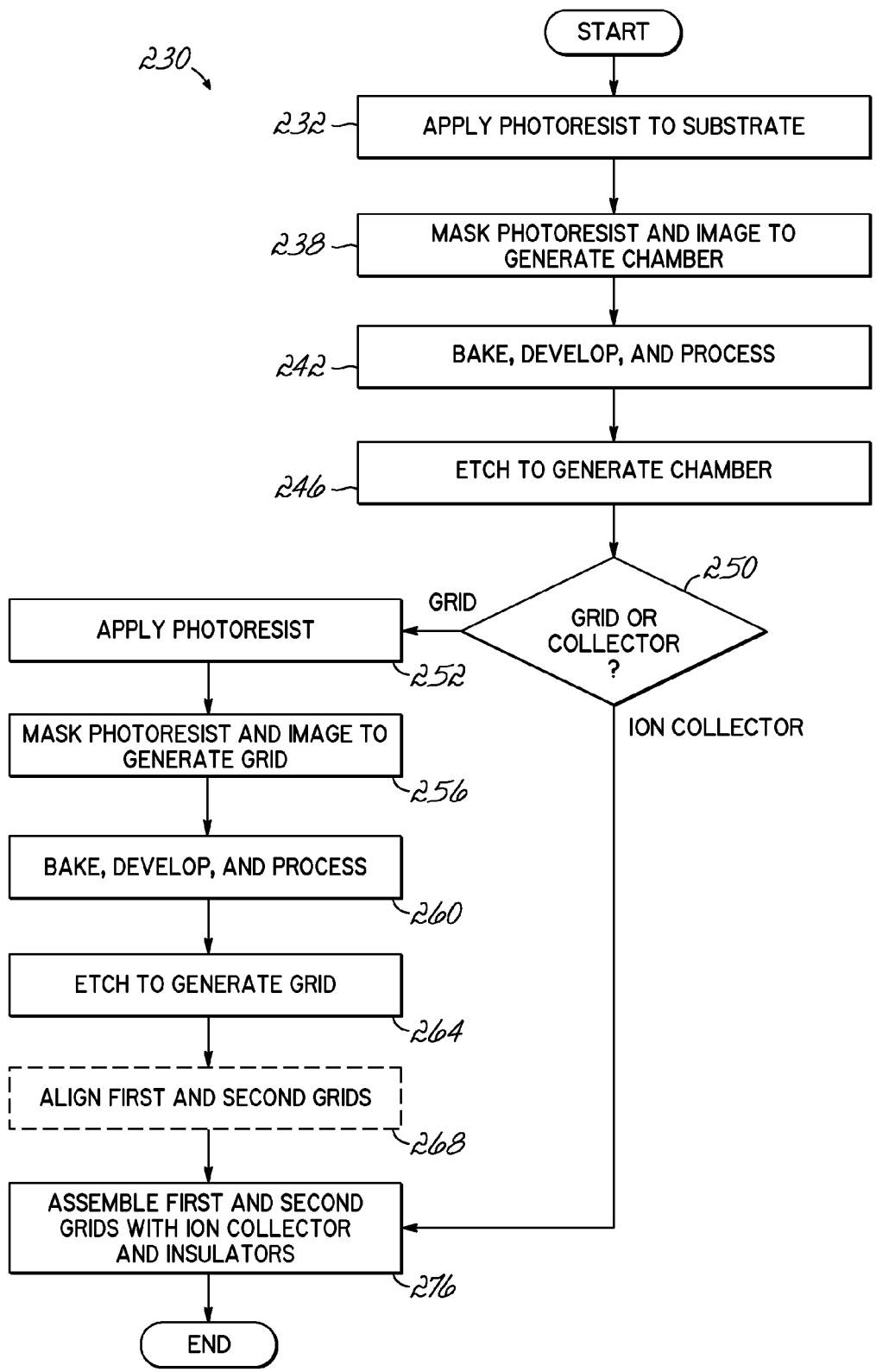
FIG. 20 is a flow chart illustrating one method of MEMS-based manufacturing of an IEA in accordance with an embodiment of the present invention.

With the details of the IEA described in detail, and turning now to FIGS. 20 and 21, a method of manufacturing the IEA 74 (FIG. 1) in accordance with one embodiment of the present invention is described. FIG. 20 is a flowchart 230 outlining the method, which is shown, schematically, in FIGS. 21A-21H.

Figure 21A:
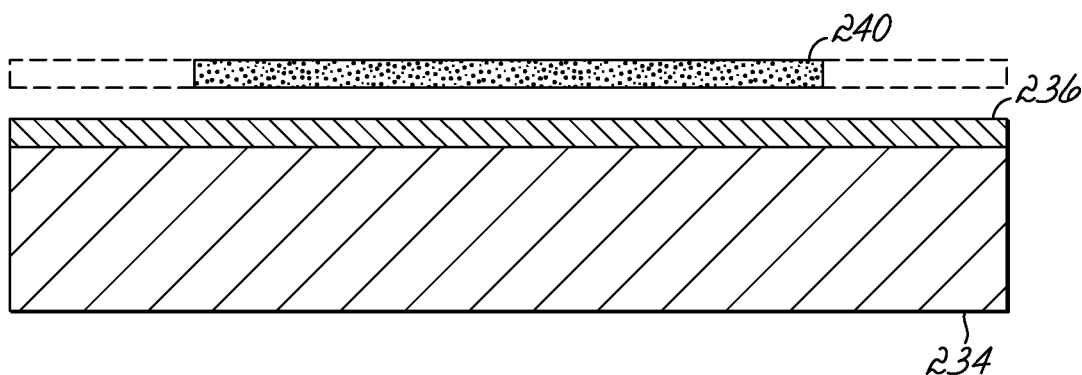
FIGS. 21A-21H are schematic representations illustrating steps of the method of FIG. 20.
Figure 21B:
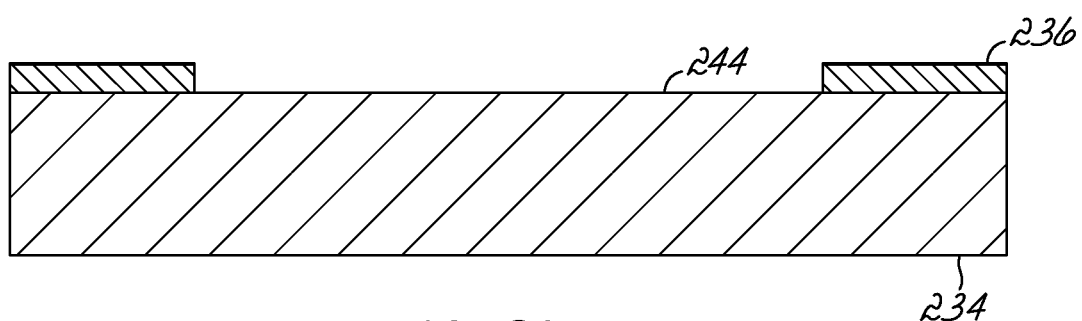
Figure 21C:
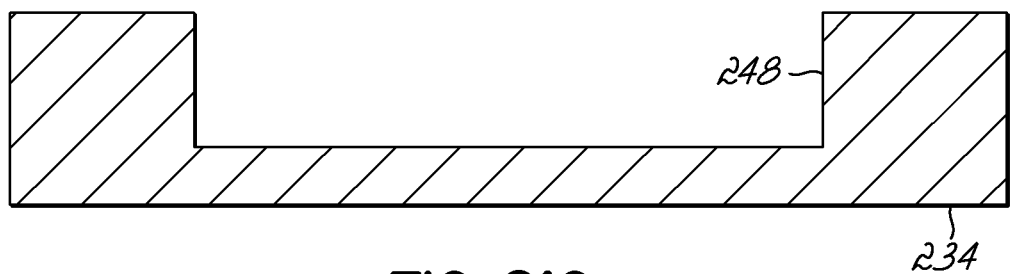

In accordance with this MEMS (Microelectromechanical Systems) based process, FIG. 21A illustrates a doped silicon substrate 234 having a photoresist layer 236 applied thereto in accordance with Step 232. The photoresist layer 236 is masked and imaged, using a mask 240 dimensioned for generating the channel (such as channel 96 of FIG. 4) in Step 238. Thereafter, in Step 242 the imaged photoresist layer 236 is baked, developed, and processed in accordance with conventional procedures to provide an etch-resistant photoresist layer 236 and an exposed surface 244 of the substrate 234, as shown in FIG. 21B. The substrate 234 is then etched in Step 246 to generate the channel 248, as shown in FIG. 21C. Etching may be performed by any known method including, for example, wet or dry etching.

The substrate 234 with channel 248, as shown in FIG. 21C, may be used as an ion collector or undergo further processing to form either the entrance grid or the selection grid. In this regard, and turning now to Decision Step 250, if one of the grids is required ("Grid" branch of Decision Step 250), then the process continues. Otherwise, if the ion collector is needed ("Ion Collector" branch of Decision Step 250), then further processing is not needed and the method goes to Step 276.

Figure 21D:
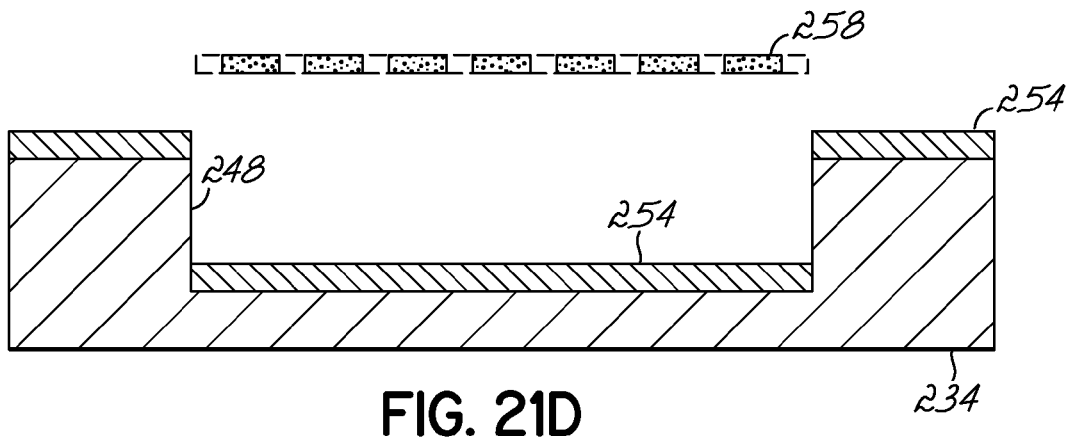
Figure 21E:
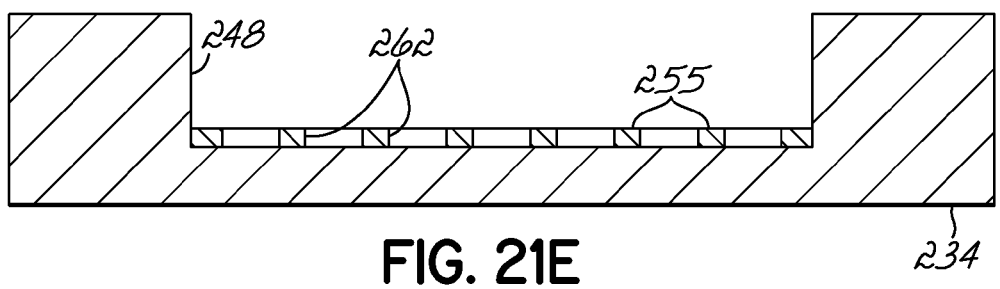
Figure 21F:
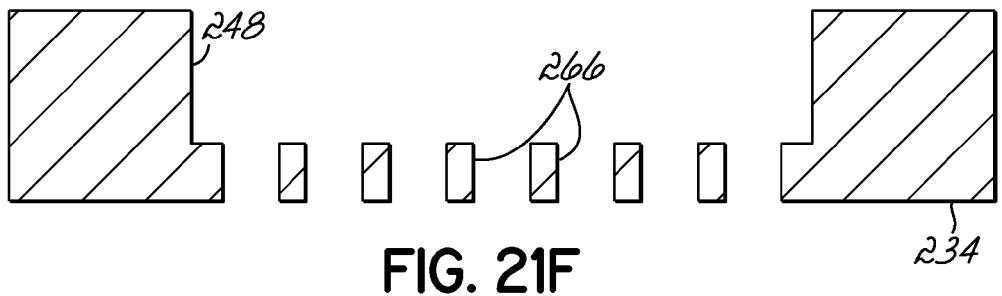

In any event, and to describe the further processing of the substrate 234, in Step 252 another photoresist layer 254 (FIG. 21D) is applied to the substrate 234 and channel 248 (FIG. 21D). A mask 258 (FIG. 21D) is applied, imaged (Step 260), baked, developed, and processed to form an etch-resistant layer photoresist 255 (FIG. 21E). The substrate 234 may be etched to create the openings 266 (FIG. 21F) for either of the entrance or selection grids.

Photoresist layers 236, 254, as described herein, may alternatively be dual mask layers, including a hard mask layer in addition to the photoresist layer itself. The wafer may include a layer of thermal oxide deposited thereupon, which may be utilized as the hard mask layer of the dual mask layer.

While the flowchart 230 provides a method in which the chamber is etched prior to the grid, one of ordinary skill of the art will appreciate that order is not necessary and that the grid could be etched prior to the chamber.

Figure 21G:
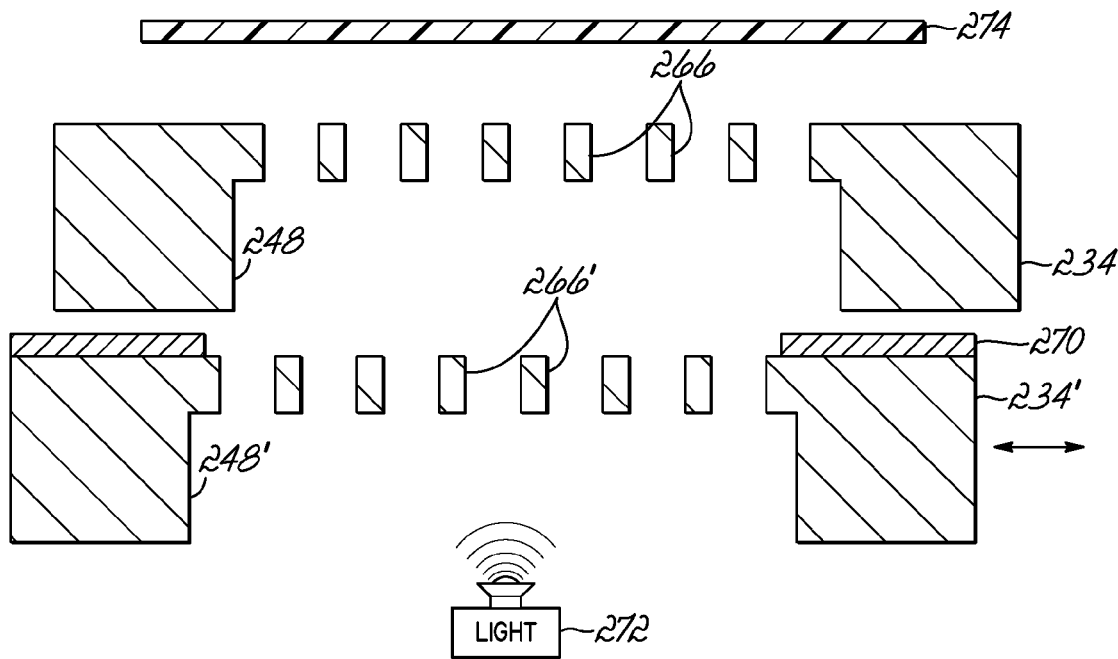
Figure 21H:
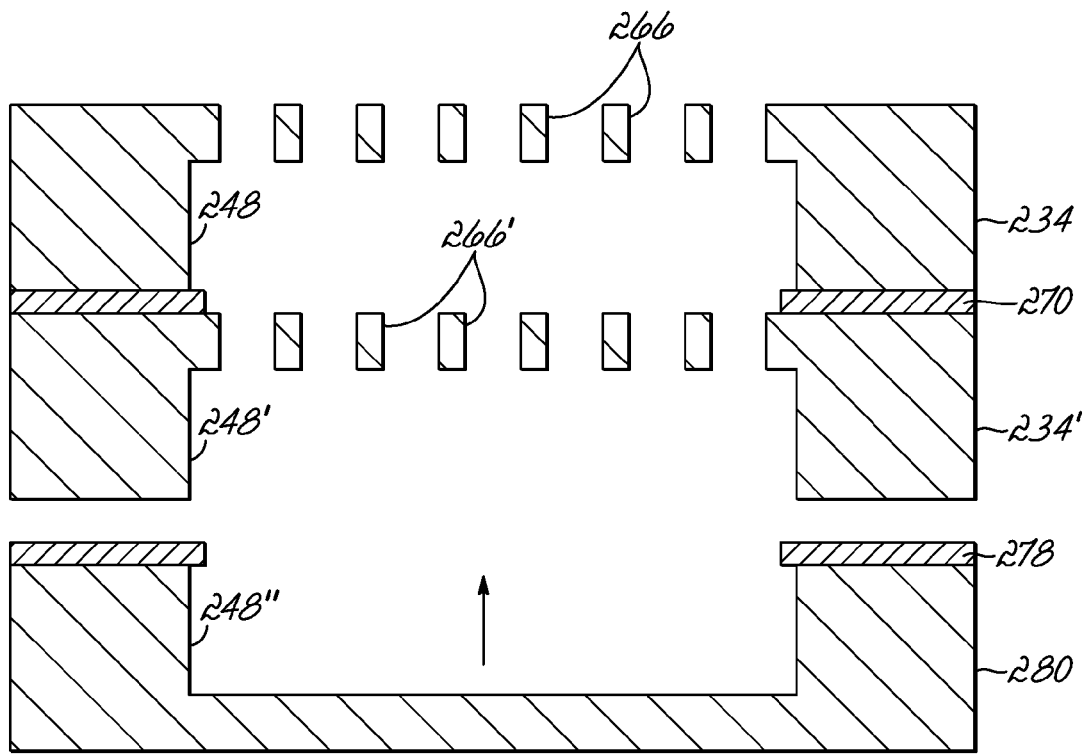
Figure 25A:
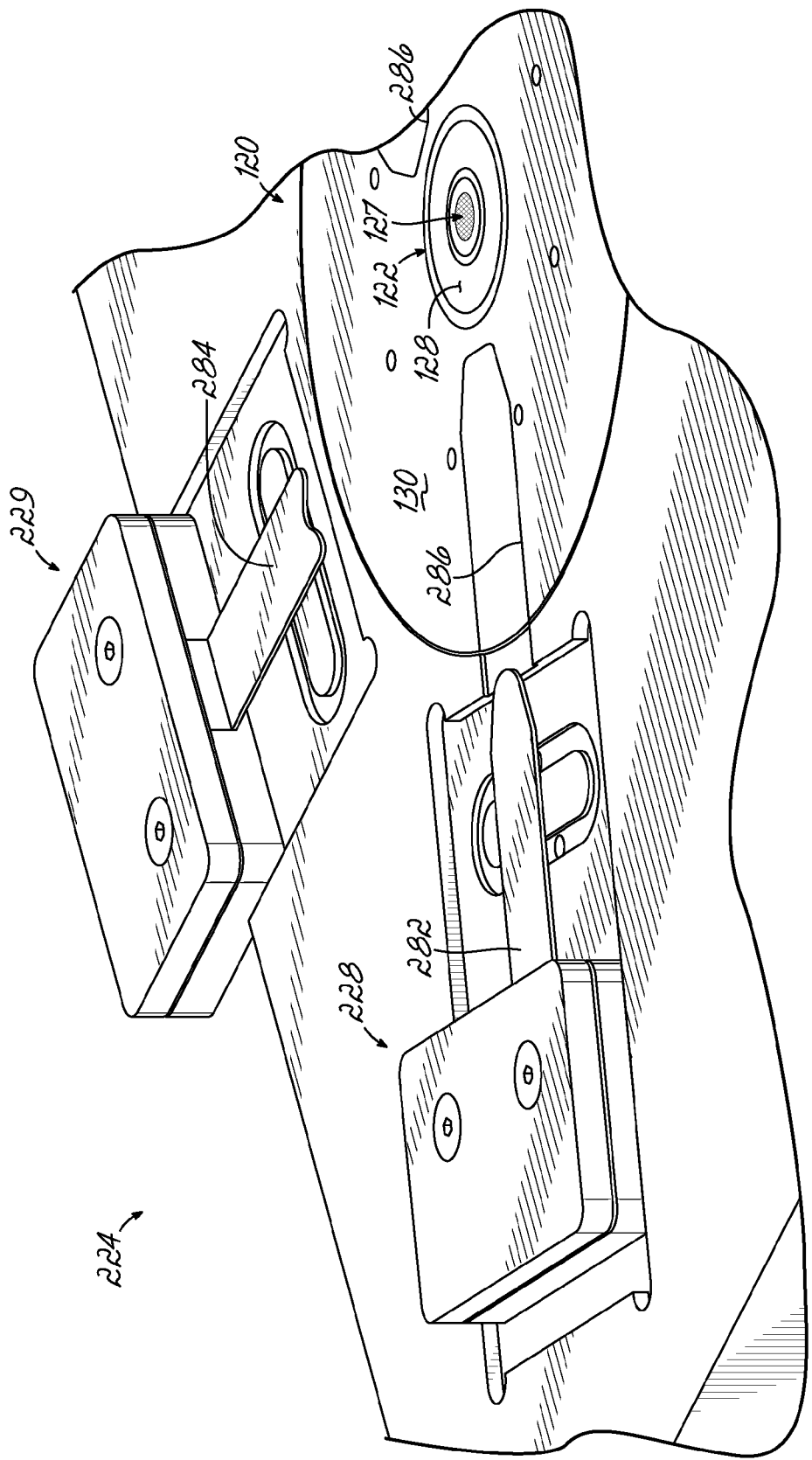
FIGS. 25A and 25B are perspective views of an alignment device for use in aligning grids of an IEA as provided in FIG. 20 and according to one embodiment of the present invention.
Figure 25B:
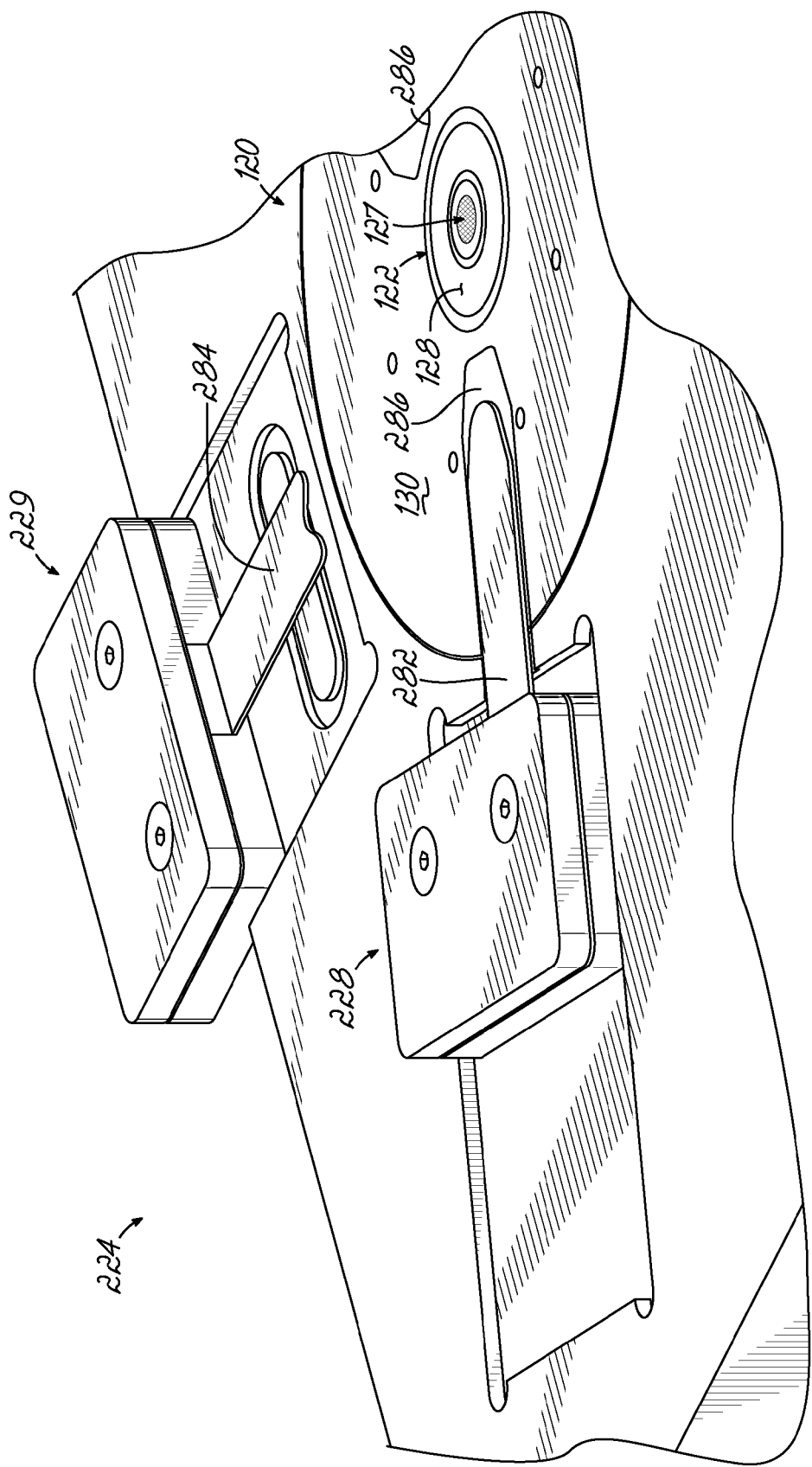

Turning now to FIGS. 21G and 21H, with still further reference to FIG. 20, one method of aligning (Step 268 of FIG. 20) and assembling (Step 276 of FIG. 20) the IEA is described in accordance with one embodiment of the present invention. In that regard two of formed grids 234, 234' are positioned vertically relative to one another with an insulator 270 therebetween, so as to form the entrance and selection grids, respectively. Although alignment may be accomplished in a variety of ways, the illustrative method includes a light 272 positioned on the back side of the grids 234, 234' and a photodiode 274 on the opposing side. The bottom grid 234' (here the selection grid) may be moved, such as by an alignment device 224 (FIGS. 25A and 25B) having one or more micrometers (two micrometers 228, 229 are shown) relative to the top grid 234 until maximum light is transmitted through the grids 234, 234', as detected by the photodiode 274. The micrometers 228, 229 may each include an arm 282, 284 configured to engage a recessed surface 286 or the perimeter of the diagnostic wafer 60.

Once light transmission is maximized, a collector 280, formed in accordance with the "Ion Collector" branch of Decision Step 250, with an insulator 278, are positioned adjacent to the first and second grids 234, 234', and secured, for example, with the bolts 148 (FIG. 8).

It should be appreciated that while the MEMS-based process has been described herein, other methods of forming the grids may alternatively be used. For example, laser drilling, Electrical Discharge Machining ("EDM," such as including a graphite electrode), electron-beam machining, and so forth.

Figure 22:
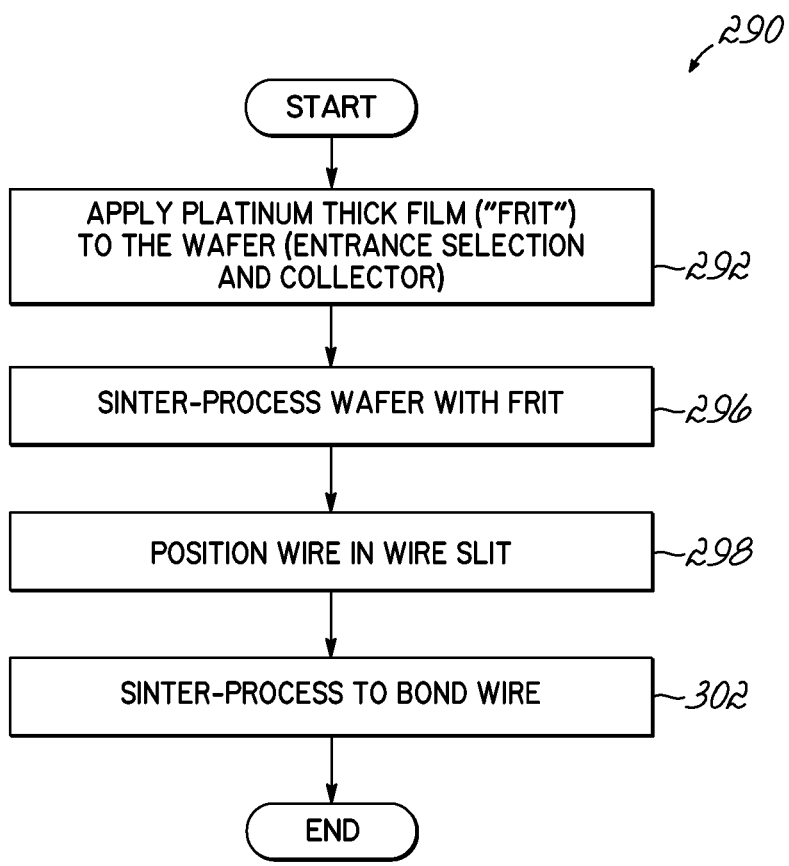
FIG. 22 is a flow chart illustrating one method of electrically coupling an IEA with an IEA controller via the feed-through system and in accordance with one embodiment of the present invention.

Once the IEA is assembled, the grids and the ion collector are electrically coupled to the IEA controller 76 (FIG. 1). Yet, conventional practice of soldering, using a tin-lead solder, is difficult on a silicon substrate 61 (FIG. 1). In that regard, and with reference now to FIGS. 22-23D, a method of forming the aforementioned electrical connection is described in detail.

Figure 23A:
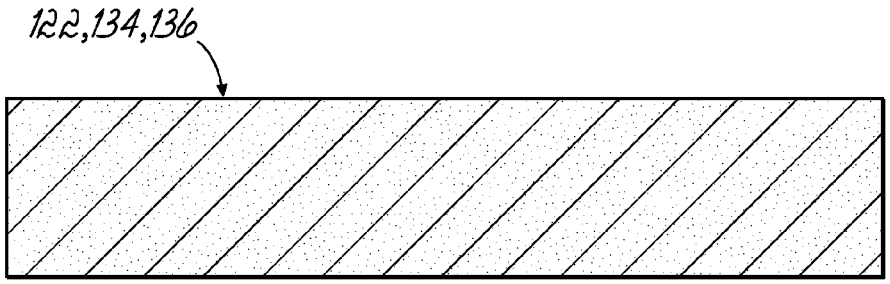
FIGS. 23A-23D are schematic representations illustrating the steps of the method of FIG. 22.
Figure 23B:
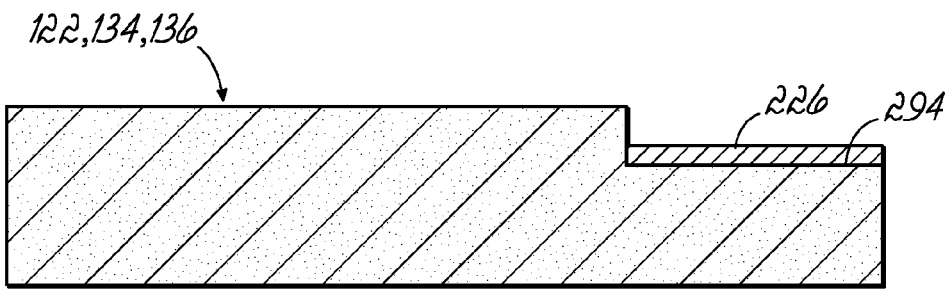

As shown in FIG. 23A, a perimeter of the entrance or selection grid 122, 134 or the ion collector 136, as appropriate, proximate a position for the electrical coupling is shown. A slit 294 may be formed by drilling, cutting, etching, or otherwise created in the substrate comprising the entrance or selection grid 122, 134 or the ion collector 136. The slit 294 is prepared with close tolerances, for example, ranging from about 10 µm to about 20 µm, around the sides of the conductor 300 forming the electrical connection. Then, in Step 292 and as shown in FIG. 23B, a platinum, Pt, and glass thick film (hereafter reference as a "frit") is applied to the slit, for example, via a vapor deposition process. The deposited Pt layer is then annealed at 500° C. for about 30 minutes to form a layer 226 of Pt that is about 5 nm thick (Step 296).

Figure 23C:
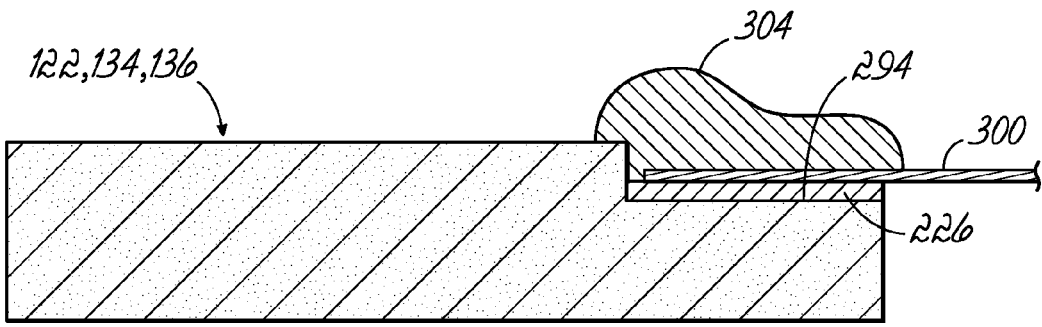
Figure 23D:
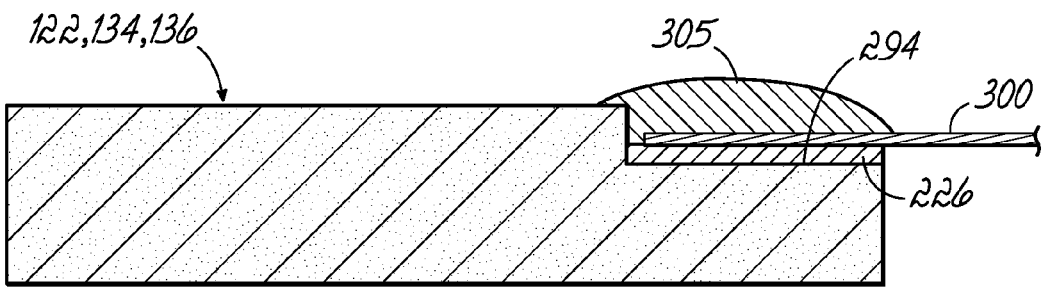

In FIG. 23C, The conductor 300 may then be positioned within the slit 294, atop the Pt layer 226 and coated with a second frit 304 (Step 298). The diagnostic wafer 120 is then fired (Step 302) with a two-step sintering process (about 300° C. and about 950° C., respectively) to electrically and mechanically bond the conductor 300 to the entrance or selection grid 122, 134 or the ion collector 136, as shown in FIG. 23D. The mechanical, and in particular, electrical bond are enhanced by the formation of platinum silicide compound at the interface between the platinum and silicon.

Figure 24:
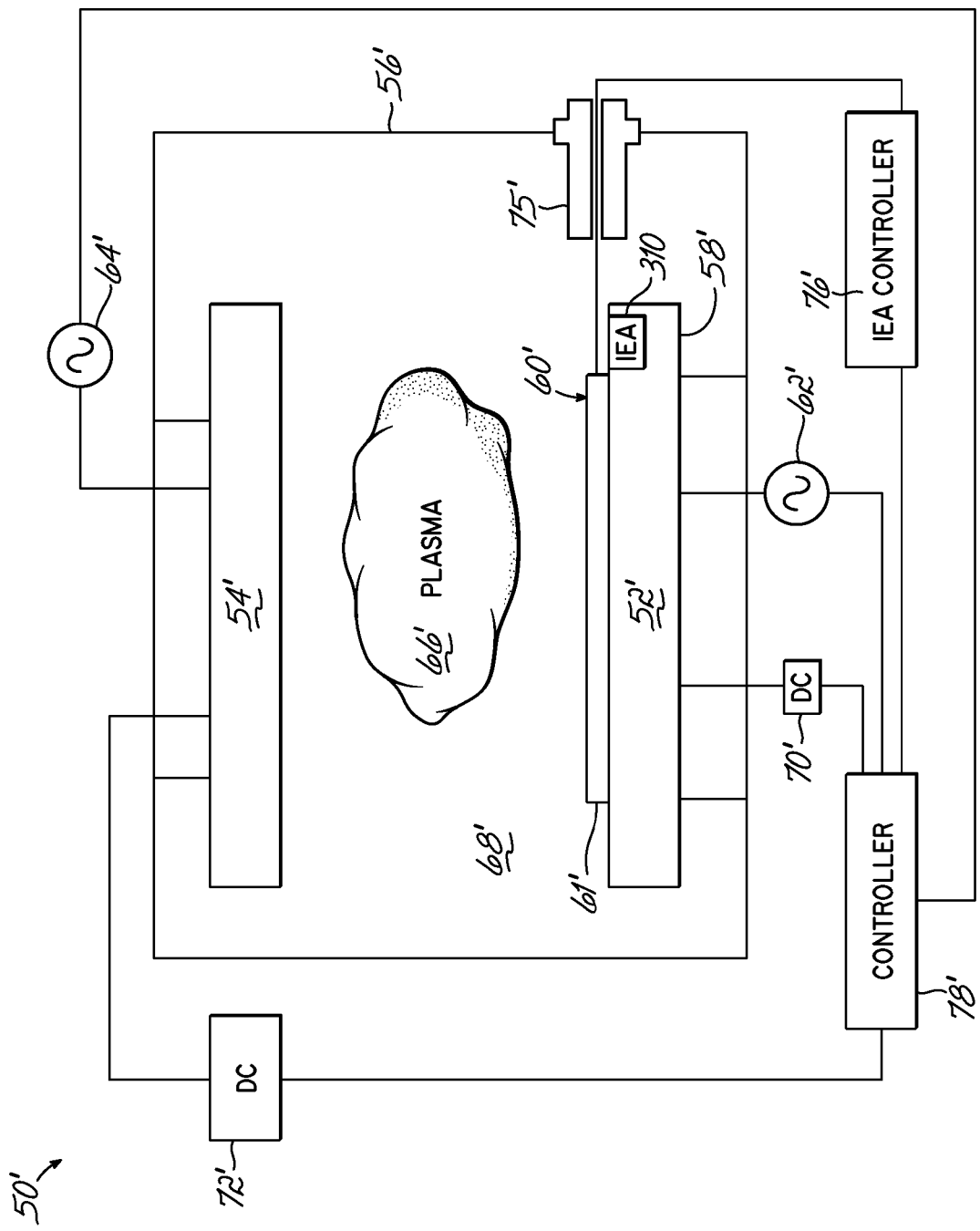
FIG. 24 schematic cross-sectional representation, similar to FIG. 1, of a diagnostic plasma processing system according to another embodiment of the present invention.

IEAs in accordance with an embodiment herein need not be limited to diagnostic wafers. Instead, with reference to FIG. 24 and in accordance with another embodiment of the present invention, a diagnostic system 50' having an IEA 310 on a plasma exposed surface is described. As shown, the IEA 310 is positioned on the substrate support 58' so as to be exposed to the plasma 66' during a plasma process. While the diagnostic wafer 60' is shown positioned on the substrate support 58', this is not necessary. Instead, and by positioning the IEA 310 into the diagnostic system 50', IED may be determined during plasma processing of any wafer, whether including a separate IEA or not. Furthermore, the position of the IEA 310 need not be limited to the particular illustrative embodiment. Instead, the position of the IEA 310 need only be limited to a surface that may be exposed to the plasma 66'. Indeed, multiple IEAs 310 may be positioned throughout the processing chamber 56' for IED determination at a plurality of locations for evaluating plasma uniformity.

While the present invention has been illustrated by description of various embodiments and while those embodiments have been described in considerable detail, those skilled in the art will readily appreciate that many modifications are possible in the exemplary embodiment without materially departing from the novel teachings and advantages of this invention. The invention in its broader aspects is therefore not limited to the specific details and illustrative examples shown and described. Accordingly, departures may be made from such details without departing from the scope of the present invention.

What is claimed is:

1. An ion energy analyzer for use in determining an ion energy distribution of a plasma, comprising:
    an entrance grid forming a first surface of the ion energy analyzer positioned as to be exposed to the plasma when the analyzer is positioned in a plasma processing apparatus, the entrance grid including a first plurality of openings, each of the openings of the first plurality having a dimension that is less than a Debye length for the plasma such that a plasma sheath at a boundary of the plasma remains relatively unperturbed and the plasma sheath does not penetrate openings of the first plurality;
    an ion collector forming a second surface of the ion energy analyzer;
    a first voltage source operably coupled to the ion collector and configured to bias the ion collector relative to the entrance grid;
    a selection grid positioned between the entrance grid and the ion collector and including a second plurality of openings;
    a second voltage source operably coupled to the selection grid and configured to selectively and variably bias the selection grid;
    an ion current meter operably coupled to the ion collector and configured to measure an ion flux onto the ion collector and transmit a signal representing the measured ion flux;
    a first insulator positioned between the entrance grid and the selection grid and configured to electrically isolate the entrance grid from the selection grid and reduce or prevent electrical breakdown therebetween, wherein a geometry of the first insulator is selected to project inwardly from each respective channel such that no straight line path exists between any two points on the entrance grid and the selection grid, respectively, from a set of all possible paths extending along a surface of the first insulator; and
    a second insulator positioned between the selection grid and the ion collector and configured to electrically isolate the selection grid from the ion collector and reduce or prevent electrical breakdown therebetween, wherein a geometry of the second insulator is selected to project inwardly from each respective channel such that no straight line path exists between any two points on the selection grid and the ion collector, respectively, from a set of all possible paths extending along a surface of the second insulator.

2. The ion energy analyzer of claim 1, further comprising:
    a controller operably coupled to the ion current meter and configured to receive the signal transmitted by the ion current meter representing the measured ion current flow and to store the signal as a function of variable bias of the selection grid.

3. The ion energy analyzer of claim 1, wherein the openings of the second plurality of the selection grid have a dimension that is at least as large as the dimension of the openings of the first plurality.

4. The ion energy analyzer of claim 1, wherein the second voltage source is further configured to vary, with respect to time and in accordance with a selected waveform, an ion selection voltage from a first voltage value to a second voltage value.

5. A diagnostic wafer, comprising:
a substrate having a plasma exposed surface and a recess extending into the plasma exposed surface; and
the ion energy analyzer of claim 1 positioned within the recess and such that the entrance grid is co-extensive with the plasma exposed surface of the substrate.

6. The diagnostic wafer of claim 5, wherein an RF impedance from the entrance grid to the substrate is lower than an RF impedance from the entrance grid to ground.

7. The diagnostic wafer of claim 5, wherein an RF impedance from the entrance grid to the substrate is lower than an RF impedance from the entrance grid to ground.

8. The diagnostic wafer of claim 7, wherein a backside of the substrate includes a recess configured to receive the selection grid and the ion collector.

9. A diagnostic wafer, comprising:
a substrate having a plasma exposed surface; and
the ion energy analyzer of claim 1, wherein the plasma exposed surface of the substrate includes the entrance grid.

10. The diagnostic wafer of claim 9, wherein a backside of the substrate includes a recess configured to receive the selection grid and the ion collector.

11. The ion energy analyzer of claim 1, wherein
the first voltage source is further configured to selectively and variably bias the ion collector relative to the entrance grid.

12. An ion energy analyzer for use in determining an ion energy distribution of a plasma, comprising:
an entrance grid forming a first surface of the ion energy analyzer positioned as to be exposed to the plasma when the analyzer is positioned in a plasma processing apparatus, the entrance grid including a first plurality of openings, each of the openings of the first plurality having a dimension that is less than a Debye length for the plasma such that a plasma sheath at a boundary of the plasma remains relatively unperturbed and the plasma sheath does not penetrate openings of the first plurality;
an ion collector forming a second surface of the ion energy analyzer;
a first voltage source operably coupled to the ion collector and configured to bias the ion collector relative to the entrance grid;
a selection grid positioned between the entrance grid and the ion collector and including a second plurality of openings;
a second voltage source operably coupled to the selection grid and configured to selectively and variably bias the selection grid;
an ion current meter operably coupled to the ion collector and configured to measure an ion flux onto the ion collector and transmit a signal representing the measured ion flux;
a first insulator positioned between the entrance grid and the selection grid and configured to electrically isolate the entrance grid from the selection grid and reduce or prevent electrical breakdown therebetween, wherein the first insulator projects inwardly from each respective channel of the entrance grid and the selection grid a length, L, that is sufficient to reduce electrical breakdown therebetween; and
a second insulator positioned between the selection grid and the ion collector and configured to electrically isolate the selection grid from the ion collector and reduce or prevent electrical breakdown therebetween, wherein the first insulator projects inwardly from each respective channel of the entrance grid and the selection grid a length, L, that is sufficient to reduce electrical breakdown therebetween.

13. The ion energy analyzer of claim 12, wherein
the entrance grid forming the first surface of the ion energy analyzer is positioned to be exposed to the plasma at a reference voltage when the analyzer is positioned in a plasma processing apparatus.

14. The ion energy analyzer of claim 12, wherein:
the first voltage source is further configured to selectively and variably bias the ion collector relative to the entrance grid; and
the second voltage source is further configured to selectively and variably bias the selection grid.

15. A method of generating a signal with the ion energy analyzer of claim 14, the method comprising:
selectively and variably biasing the selection grid relative to the entrance ground.

16. The method of claim 15, further comprising:
detecting a potential of the entrance grid before selectively and variably biasing the selection grid.

17. The ion energy analyzer of claim 14, wherein the second voltage source is further configured to vary, with respect to time and in accordance with a selected waveform, an ion selection voltage from a first voltage value to a second voltage value.

18. The ion energy analyzer of claim 12, wherein a geometry of the first insulator is selected such that no straight line path exists between any two points on the entrance grid and the selection grid, respectively, from a set of all possible paths extending along a surface of the first insulator.

19. The ion energy analyzer of claim 12, wherein a geometry of the second insulator is selected such that no straight line path exists between any two points on the selection grid and the ion collector, respectively, from a set of all possible paths extending along a surface of the second insulator.

20. A diagnostic wafer configured to determine an ion energy distribution of a plasma, the diagnostic wafer comprising:
a substrate with a plasma exposed surface and a recess extending into the plasma exposed surface; and
the ion energy analyzer of claim 12 positioned within the recess and being co-extensive with the plasma exposed surface of the substrate.

21. The diagnostic wafer of claim 20, wherein an RF impedance from the entrance grid to the substrate is lower than an RF impedance from the entrance grid to ground.

22. A diagnostic wafer, comprising:
a substrate having a plasma exposed surface; and
the ion energy analyzer of claim 12, wherein the plasma exposed surface of the substrate includes the entrance grid.

23. The diagnostic wafer of claim 22, wherein a backside of the substrate includes a recess configured to receive the selection grid and the ion collector.

24. The ion energy analyzer of claim 12, further comprising:
a controller operably coupled to the ion current meter and configured to receive the signal transmitted by the ion current meter representing the measured ion current flow and to store the signal as a function of variable bias of the selection grid.

25. The ion energy analyzer of claim 12, wherein the openings of the second plurality of openings for the selection grid have a dimension that is at least as large as the dimension of the openings of the first plurality of openings.

\* \* \* \* \*